(12) United States Patent
Tang et al.

(10) Patent No.: US 10,681,289 B2
(45) Date of Patent: Jun. 9, 2020

(54) DESIGNS AND METHODS OF MULTI-FUNCTION DIGITAL READOUT INTEGRATED CIRCUITS WITH AN EMBEDDED PROGRAMMABLE GATE ARRAY

(71) Applicant: L3 Cincinnati Electronics Corporation, Mason, OH (US)

(72) Inventors: Nansheng Tang, Mason, OH (US); George Buritica, Mason, OH (US); Doug Droege, Mason, OH (US); Dave Forrai, Mason, OH (US); John Forsthoefel, Mason, OH (US); Mike Spicer, Mason, OH (US); Al Timlin, Mason, OH (US); Stefan Lauxtermann, Mason, OH (US); Edward S. Brinkman, Mason, OH (US)

(73) Assignee: L3 CINCINNATI ELECTRONICS CORPORATION, Mason, OH (US)

( * ) Notice: Subject to any disclaimer, the term of this patent is extended or adjusted under 35 U.S.C. 154(b) by 0 days.

(21) Appl. No.: 16/394,871

(22) Filed: Apr. 25, 2019

(65) Prior Publication Data
US 2019/0335117 A1   Oct. 31, 2019

Related U.S. Application Data

(60) Provisional application No. 62/662,449, filed on Apr. 25, 2018.

(51) Int. Cl.
*H04N 5/33* (2006.01)
*H01L 27/148* (2006.01)

(52) U.S. Cl.
CPC ......... *H04N 5/33* (2013.01); *H01L 27/14856* (2013.01); *H01L 27/14881* (2013.01)

(58) Field of Classification Search
CPC ................ H04N 5/33; H01L 27/14881; H01L 27/14856
See application file for complete search history.

(56) References Cited

U.S. PATENT DOCUMENTS

| | | |
|---|---|---|
| 5,563,405 A | 10/1996 | Woolaway, II et al. |
| 6,040,568 A | 3/2000 | Caulfield et al. |

(Continued)

FOREIGN PATENT DOCUMENTS

| | | |
|---|---|---|
| CN | 205940775 U | 2/2017 |
| KR | 20180028565 A | 3/2018 |

*Primary Examiner* — Tsion B Owens
(74) *Attorney, Agent, or Firm* — Dinsmore & Shohl LLP

(57) ABSTRACT

Embodiments disclosed herein relate to a ROIC with a plurality of unit cells coupled to a detector array having a plurality of detectors for collecting photoelectrons over a plurality of temporal instances. An individual unit cell is electrically coupled to an individual detector to have one-to-one correspondence and includes one or more storage elements coupled to one or more programmable logic control switches. The storage element(s) store signal charges representing the photoelectrons while the programmable logic control switch(es) direct the signal charges from the storage element(s) at an individual temporal instance. A configuration of signal charges in the plurality of unit cells is mathematically operated as a three-dimensional matrix having a plurality of elements, where the three dimensions correspond to the two spatial dimensions of an individual unit cell and the individual temporal instance, and an individual element has a value corresponding to the number of signal charges stored therein.

38 Claims, 13 Drawing Sheets

(56) References Cited

U.S. PATENT DOCUMENTS

| | | |
|---|---|---|
| 6,605,806 B2 | 8/2003 | Walmsley et al. |
| 6,910,060 B2 | 6/2005 | Langan et al. |
| 7,135,680 B2 | 11/2006 | Elkind et al. |
| 7,459,686 B2 | 12/2008 | Syllaois et al. |
| 7,551,059 B2 * | 6/2009 | Farrier .............. H01L 27/14603 |
| | | 250/208.1 |
| 8,120,687 B2 * | 2/2012 | Nishino ................ H04N 5/341 |
| | | 250/208.1 |
| 8,179,296 B2 | 5/2012 | Kelly et al. |
| 8,519,879 B1 | 8/2013 | Denham |
| 8,610,065 B2 | 12/2013 | Ha et al. |
| 8,692,176 B2 | 4/2014 | Kelly et al. |
| 8,704,144 B2 | 4/2014 | Elliott et al. |
| 8,779,342 B2 | 7/2014 | Denham |
| 8,890,052 B2 | 11/2014 | Denham |
| 9,001,234 B2 | 4/2015 | Petilli |
| 9,060,141 B2 | 6/2015 | Wilson et al. |
| 9,063,012 B2 | 6/2015 | Thorne |
| 9,215,386 B2 | 12/2015 | Elkind et al. |
| 9,253,418 B2 | 2/2016 | Warashina et al. |
| 9,294,690 B1 | 3/2016 | Caulfield |
| 9,410,850 B2 | 8/2016 | Novotny et al. |
| 9,442,020 B2 | 9/2016 | Durand et al. |
| 9,686,483 B2 | 6/2017 | Bagwell et al. |
| 9,866,773 B2 | 1/2018 | Caulfield |
| 10,009,014 B1 | 6/2018 | Hairston |
| 10,419,700 B2 * | 9/2019 | Matsuda ................ H04N 5/367 |
| 2011/0210251 A1 * | 9/2011 | Onakado .................. H04N 5/33 |
| | | 250/332 |
| 2014/0048683 A1 | 2/2014 | Soh et al. |
| 2016/0100114 A1 | 4/2016 | Bergey et al. |

\* cited by examiner

DESIGNS AND METHODS OF MULTI-FUNCTION DIGITAL READOUT INTEGRATED CIRCUITS WITH AN EMBEDDED PROGRAMMABLE GATE ARRAY

CROSS-REFERENCE TO RELATED APPLICATIONS

This application claims priority to U.S. Provisional Patent Application No. 62/662,449 entitled "Designs and Methods of Multi-Function Digital Readout Integrated Circuits with an Embedded Programmable Gate Array" and filed on Apr. 25, 2018, which is hereby incorporated by reference in its entirety.

TECHNICAL FIELD

The present specification generally relates to multi-function digital readout integrated circuits (ROIC), and more specifically, to design and operation of multi-function ROICs that enable programmable controls in receiving, storing, and mathematically operating information extracted at or near the point of incidence of infrared radiation.

BACKGROUND

Traditional ROICs are typically designed to convert signal charges representing photoelectrons received from infrared radiation into voltage, and outputting the voltage signal possibly with a gain, or the digitized version of the voltage signal. In essence, a traditional ROIC is a charge-to-voltage converter, possibly followed by an analog-to-digital converter. Extraction of information is typically left to be conducted further downstream in the signal train, typically in the digital domain. This traditional approach encounters a range of practical operational challenges such as latency, weak noise performance, and output signal bandwidth requirements. The challenges become particularly acute for today's applications requiring low noise, desirable bandwidth, ultra large format, high frame rate, and dual-polarity ROICs and the multi-function sensors built on them.

SUMMARY

The present specification relates to a multi-function readout integrated circuit (ROIC) with an embedded programmable gate array. In one embodiment, a ROIC is coupled to a detector array having a plurality of detectors for collecting photoelectrons over a plurality of temporal instances. The ROIC includes a plurality of unit cells arranged in two spatial dimensions. An individual unit cell of the plurality of unit cells is electrically coupled to an individual detector of the plurality of detectors to have one-to-one correspondence. An individual unit cell includes one or more storage elements and one or more programmable logic control switches coupled to the one or more storage elements. The one or more storage elements store signal charges representing the photoelectrons collected by the detector array at an individual temporal instance of the plurality of temporal instances. The one or more programmable logic control switches direct the signal charges towards or away from the one or more storage elements at the individual temporal instance. A configuration of signal charges in the plurality of unit cells is mathematically represented and operated as a matrix in three dimensions having a plurality of elements, where the three dimensions correspond to the two spatial dimensions and the individual temporal instance. An individual element of the matrix has a value corresponding to the number of signal charges stored in the individual unit cell at the individual temporal instance.

In another embodiment, an infrared sensor assembly includes a detector array and a ROIC coupled to the detector array. The detector array has a plurality of detectors for collecting photoelectrons over a plurality of temporal instances. The ROIC is coupled to the detector array and includes a plurality of unit cells arranged in two spatial dimensions. An individual unit cell of the plurality of unit cells is electrically coupled to an individual detector of the plurality of detectors to have one-to-one correspondence. An individual unit cell includes one or more storage elements and one or more programmable logic control switches coupled to the one or more storage elements. The one or more storage elements store signal charges representing the photoelectrons collected by the detector array at an individual temporal instance of the plurality of temporal instances. The one or more programmable logic control switches direct the signal charges towards or away from the one or more storage elements at the individual temporal instance. A configuration of signal charges in the plurality of unit cells is mathematically represented and operated as a matrix in three dimensions having a plurality of elements, where the three dimensions correspond to the two spatial dimensions and the individual temporal instance. An individual element of the matrix has a value corresponding to the number of signal charges stored in the individual unit cell at the individual temporal instance of the plurality of temporal instances.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments described herein are directed to multi-function ROICs with an embedded programmable gate array. The individual unit cells of the ROICs described herein have different combinations of one or more circuit modules for receiving, storing and mathematically operating signal charges received from the individual detectors of a detector array over a period of time. Circuit topologies having different combinations of the one or more circuit modules are designed to function as an embedded programmable gate array within the ROIC. Accordingly, the signal charges within the individual unit cells as well as across different subsets of individual unit cells within the ROIC can be controlled for extraction of information in the ROIC itself and subsequent production of infrared images. The extraction of information-enriched data at or near the point of incidence of the infrared radiation and subsequent processing of the information-enriched data in the analog domain enables the production of infrared images with the least latency, minimal noise, while consuming the least amount of bandwidth and energy.

Figure 1:
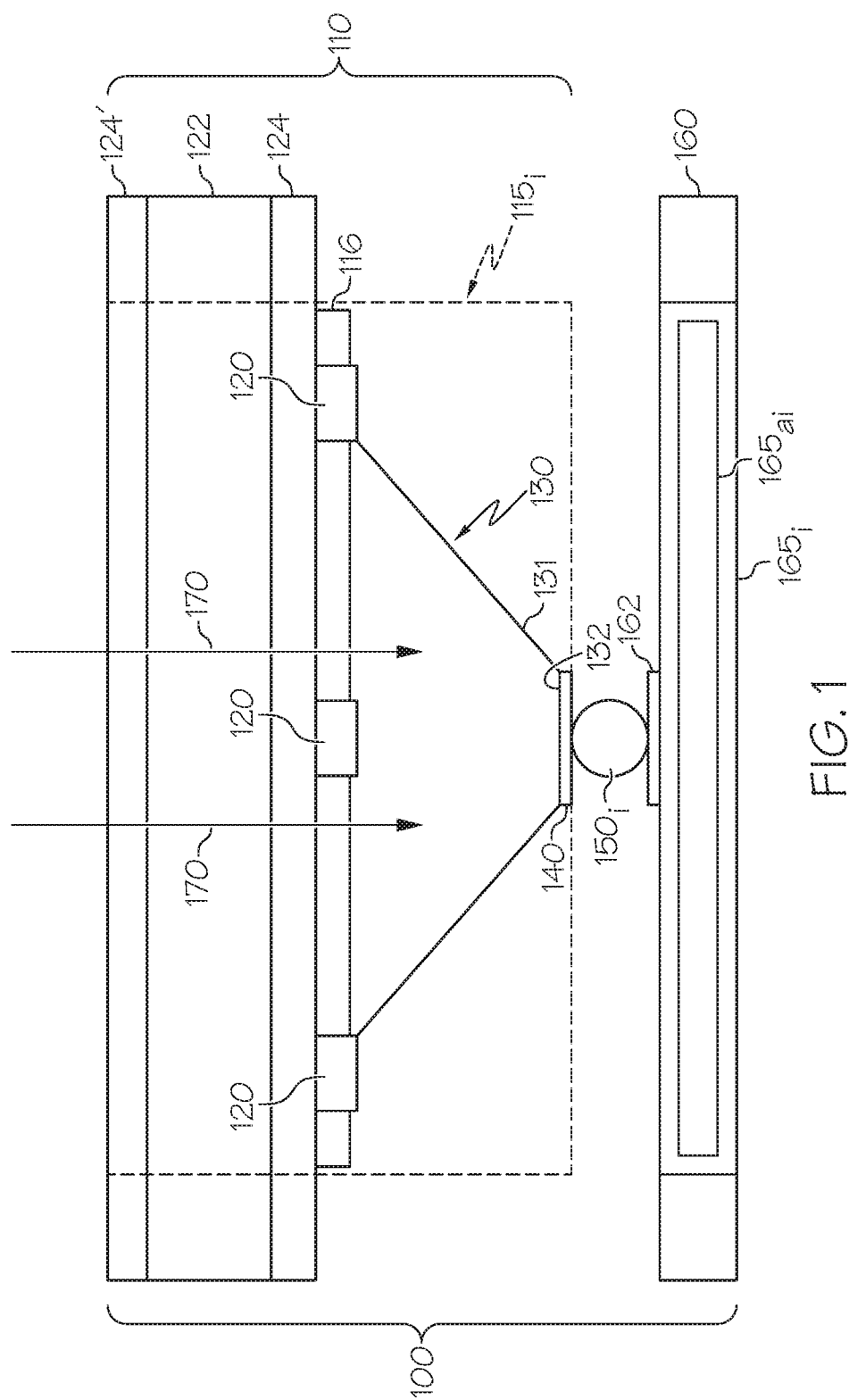
FIG. 1 depicts a schematic illustration of a side view of an infrared sensor assembly having a readout integrated circuit (ROIC) coupled to a detector array, according to one or more embodiments shown and described herein.

Referring to FIG. 1, a schematic illustration of a side view of an infrared sensor assembly 100 is depicted. The infrared sensor assembly 100 has a detector array 110 coupled to a readout integrated circuit (ROIC) 160 through a bonding bump $150_i$. The detector array 110 includes a plurality of detectors $115_i$ for collecting photoelectrons over a plurality of temporal instances $T_i$. While the detector array 110 depicted in FIG. 1 is an infrared focal plane array and the individual detector $115_i$ represents an individual pixel of a plurality of pixels of the focal plane array, the embodiments described herein are not limited as such. The non-limiting example individual detector $115_i$ of the detector array 110 shown in FIG. 1 includes a transparent substrate 122 disposed between two anti-reflective layers 124 and 124', a frontside common electrical contact 120, a pyramid-shaped absorber layer 130 and a backside electrical contact 140. It should be understood that embodiments are not limited to the detector $115_i$ shown in FIG. 1, and the detector array 110 may take on other configurations. While the detector array 110 includes a plurality of detectors $115_i$, only one detector $115_i$ is illustrated in FIG. 1 for ease of illustration.

The transparent substrate 122 comprises a material that is transparent to radiation in the desired wavelength, such as wavelengths in the infrared or near-infrared spectrum. The transparent substrate 122, which may be made of silicon, for example, provides a window or an entry point for radiation (illustrated as arrows 170) into the detector array 110. Optional anti-reflective layers 124 and 124' may be applied to the transparent substrate 122 to increase the infrared radiation entering the detector array 110.

The absorber layer 130 is coupled to the frontside common electrical contact 120 at a first end and the backside electrical contact 140 at a second end opposite to the first end. In one embodiment, the absorber layer 130 is bonded to the transparent substrate 122 via an adhesive bonding layer 116 such as, but not limited to, an epoxy adhesive. The backside electrical contact 140 is connected to a surface 132 of the absorber layer 130.

The ROIC 160 includes a ROIC substrate (of M rows and N columns) divided into a plurality of unit cells $165_i$ arranged in two spatial dimensions (say, $X_i$ and $Y_i$ on the plane of the ROIC 160). While the ROIC 160 includes the plurality of unit cells $165_i$, only one unit cell $165_i$ is illustrated in FIG. 1 for ease of illustration. The individual unit cell $165_i$ is electrically coupled to an individual detector $115_i$ through the bonding bump $150_i$ and an electrical contact 162 of the ROIC 160 to form a one-to-one correspondence.

In operation, infrared radiation (illustrated by arrows 170) is transmitted through the transparent substrate 122 and the anti-reflective layers 124 and 124' into the absorber layer 130. The absorber layer 130 converts the incident infrared radiation into photoelectrons that are transmitted as signal charges through the bonding bump $150_i$ and the electrical contact 162 into the individual unit cell $165_i$.

The individual unit cells $165_i$ have different combinations of one or more circuit modules $165_{ai}$ for receiving, storing and mathematically operating the signal charges received from the individual detectors $115_i$. The individual circuit module $165_{ai}$ includes one or more storage elements $C_i$ for storing signal charges representing the photoelectrons collected by the corresponding detector $115_i$ at the individual temporal instance $T_i$. In some embodiments, the storage element $C_i$ for storing signal charges may be a capacitor, though in other embodiments, any electrical or electronic component capable of storing charges may be used. The one or more storage elements $C_i$ are coupled to one or more programmable logic control switches $S_i$ for directing the signal charges towards or away from the one or more storage elements $C_i$ at the individual temporal instance $T_i$.

A configuration of signal charges stored in the plurality of unit cells $165_i$ at the individual temporal instance $T_i$ can be mathematically represented by a three-dimensional matrix $P_{Ti}$ having a plurality of elements $q_i$, where the three dimensions correspond to the two spatial dimensions $X_i$, $Y_i$ of the individual unit cell $165_i$ (row number and column number of the unit cells $165_i$) and the individual temporal instance $T_i$. The number of signal charges stored in the unit cell $165_i$ having dimensions $X_i$, $Y_i$ at the individual temporal instance $T_i$ can thus be represented by a unique value as a function of $X_i$, $Y_i$ and $T_i$ and forms the individual element $q_i$ of the three-dimensional matrix $P_{Ti}$. Accordingly, the three-dimensional matrix $P_{Ti}$ having a plurality of elements $q_i$ can be mathematically operated to extract information from the of signal charges. Any mathematically allowable operation of the three-dimensional matrix $P_{Ti}$, regardless of the number of operands, can perceivably be performed to achieve a desired outcome by programmable logic control switches purposely designed in and controlled by the programmable logic gates, to achieve such desired outcome, preferably in the analog domain to achieve the intended benefits.

Figure 2A:
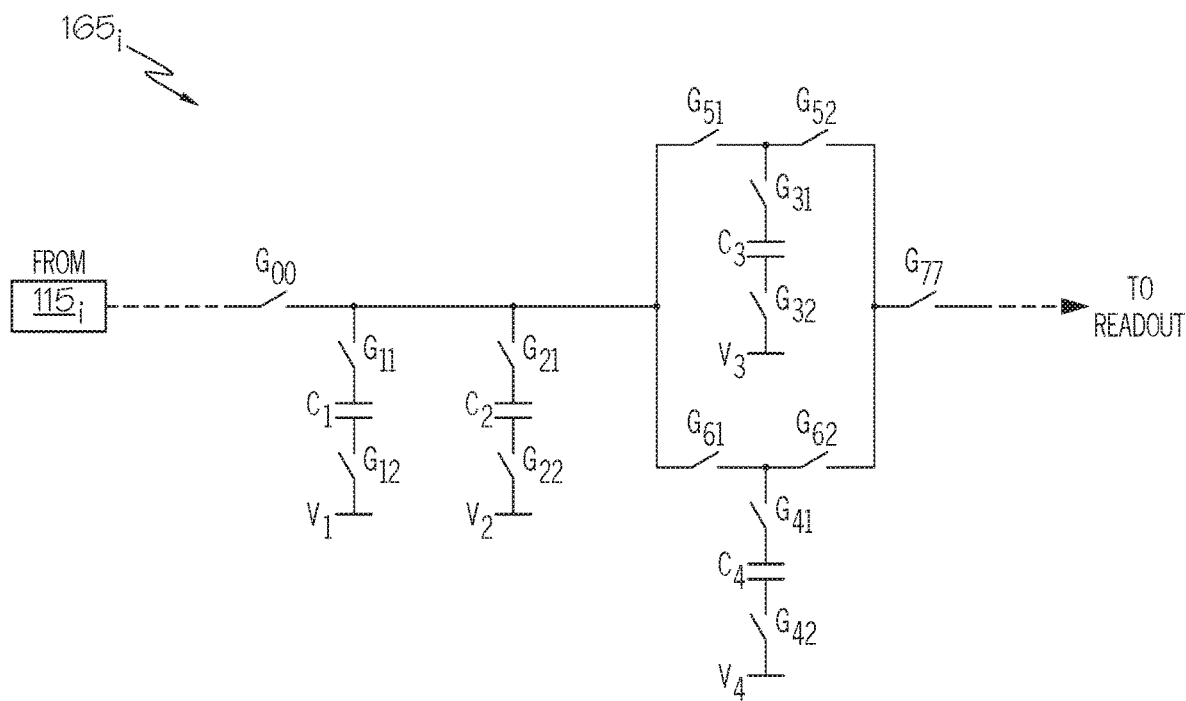
FIG. 2A depicts a schematic illustration of an example circuit topology used in the ROIC of an infrared sensor assembly, according to one or more embodiments shown and described herein.

Circuit topologies having different combinations of one or more circuit modules $165_{ai}$ can function as embedded programmable gate arrays within the ROIC 160. FIG. 2A depicts a schematic illustration of an example circuit topology using the exemplary circuit module $165_{ai}$ shown in FIG. 2B. The exemplary circuit module $165_{ai}$ includes a storage element $C_x$ electrically connected to an individual programmable logic control switch $G_{x1}$ at one end and to another individual programmable logic control switch $G_{x2}$ at the opposite end. The individual programmable logic control switch $G_{x2}$ is electrically connected at the other end to a controllable voltage source $V_x$ (bias control). Accordingly, when the individual programmable logic control switch $G_{x1}$ is closed at an individual temporal instance $T_i$, signal charges are directed towards the storage element $C_x$ in series with the individual programmable logic control switch $G_{x1}$. The individual programmable logic control switch $G_{x2}$ is used to connect to different bias $V_x$ at logically-controlled timing.

Figure 2B:
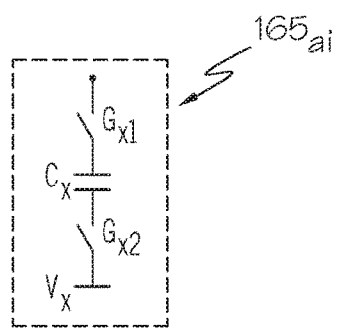
FIG. 2B depicts an example circuit module used in the example circuit topology of FIG. 2A, according to one or more embodiments shown and described herein.

Any number of circuit modules $165_{ai}$ such as, but not limited to, the one shown in FIG. 2B and the ones shown in FIGS. 3A, 4A, 5A, 6A, 7A, and 8A can be combined in series or parallel within the individual unit cell $165_i$. The resultant combination of physical circuit modules $165_{ai}$ in the individual unit cell $165_i$, together with any necessary circuitry usually residing in the periphery of the unit cells $165_i$, forms an embedded programmable gate array. The embedded programmable gate array can be represented mathematically as the three-dimensional matrix $P_{Ti}$ and operated in the signal domain in a sequence of matrix operations to control the input and manipulate the output of signal charges stored in the multiple storage elements $C_x$ of the individual unit cells $165_i$ as is shown in FIG. 2A. Bias control and/or sequential operation of a number of programmable logic control switches can be used to support dual polarity of the storage elements $C_x$ to direct the flow of signal charges towards or away from the storage elements $C_x$.

In the example circuit topology of the individual unit cell $165_i$ shown in FIG. 2A, signal charges can pass through a set of the programmable logic control switches $G=\{G_{00}, G_{11}, G_{12}, G_{21}, G_{22}, G_{31}, G_{32}, G_{41}, G_{42}, G_{51}, G_{52}, G_{61}, G_{62}, G_{77}, \ldots\}$ or a subset thereof before leaving the individual unit cell $165_i$. The signal charges are directed towards or away from the one or more storage elements $C_x$ in series with the individual programmable logic control switches $G_{x1}$, depending on whether the individual programmable logic control switches $G_{x1}$ form a closed switch or an open switch respectively. If the programmable logic control switch $G_{00}$ is closed, the signal charges enter the individual unit cell $165_i$. On the other hand, if the programmable logic control switch $G_{00}$ is open, the signal charges cannot enter the individual unit cell $165_i$. The examples described below demonstrate how signal charges can be directed to move through the example circuit topology of the individual unit cell $165_i$ shown in FIG. 2A.

In a first non-limiting example, the signal charges may be subsequently stored in the storage element $C_1$ if the programmable logic control switch $G_{11}$ is closed, $G_{12}$ closed to a proper bias $V_1$, and the programmable logic control switches $G_{21}$, $G_{51}$ and $G_{61}$ are open and will remain stored in $C_1$. The signal charges stored in the storage element $C_1$ may subsequently be directed towards the storage element $C_2$ by keeping the programmable logic control switches $G_{51}$, and $G_{61}$ open and closing the programmable logic control switches $G_{11}$ and $G_{21}$ with $G_{22}$ closed to a proper bias $V_2$. As an alternative, the signal charges stored in the storage element $C_1$ may be directed towards the storage element $C_3$ by keeping the programmable logic control switches $G_{21}$, $G_{52}$ and $G_{61}$ open and closing the programmable logic control switches $G_{11}$, $G_{31}$ and $G_{51}$, with $G_{32}$ closed to a proper bias $V_3$. As another alternative, the signal charges stored in the storage element $C_1$ may be directed towards the storage element $C_4$ by keeping the programmable logic control switches $G_{21}$, $G_{51}$ and $G_{62}$ open and closing the programmable logic control switches $G_{11}$, $G_{41}$ and $G_{61}$ with $G_{42}$ closed to a proper bias $V_4$. Finally, the signal charges stored in the storage element $C_1$ may be directed towards an adjacent unit cell $165_i$ or read out by keeping the programmable logic control switches $G_{21}$, $G_{31}$ and $G_{41}$ open and closing the programmable logic control switches $G_{11}$, $G_{77}$, and either both programmable logic control switches $G_{51}$, $G_{52}$ or both programmable logic control switches. $G_{61}$, $G_{62}$, while keeping $G_{12}$ closed to a proper bias $V_1$.

In a second non-limiting example, the signal charges may be subsequently stored in the storage element $C_2$ if the programmable logic control switch $G_{21}$ is closed, $G_{22}$ closed to a proper bias $V_2$, and the programmable logic control switches $G_{11}$, $G_{51}$ and $G_{61}$ are open and will remain stored in $C_2$. The signal charges stored in the storage element $C_2$ may subsequently be directed towards the storage element $C_1$ by keeping the programmable logic control switches $G_{51}$, and $G_{61}$ open and closing the programmable logic control switches $G_{11}$ and $G_{21}$ with $G_{12}$ closed to a proper bias $V_1$. As an alternative, the signal charges stored in the storage element $C_2$ may be directed towards the storage element $C_3$ by keeping the programmable logic control switches $G_{11}$, $G_{52}$ and $G_{61}$ open and closing the programmable logic control switches $G_{21}$, $G_{31}$ and $G_{51}$ with $G_{32}$ closed to a proper bias $V_3$. As another alternative, the signal charges stored in the storage element $C_2$ may be directed towards the storage element $C_4$ by keeping the programmable logic control switches $G_{11}$, $G_{51}$ and $G_{62}$ open and closing the programmable logic control switches $G_{21}$, $G_{41}$ and $G_{61}$ with $G_{42}$ closed to a proper bias $V_4$. Finally, the signal charges stored in the storage element $C_2$ may be directed towards an adjacent unit cell 165$_i$ or read out by keeping the programmable logic control switches $G_{11}$, $G_{31}$ and $G_{41}$ open and closing the programmable logic control switches $G_{21}$, $G_{77}$, and either both programmable logic control switches $G_{51}$, $G_{52}$ or both programmable logic control switches. $G_{61}$, $G_{62}$, while keeping $G_{22}$ closed to a proper bias $V_2$.

In a third non-limiting example, the signal charges may be subsequently stored in the storage element $C_3$ if the programmable logic control switches $G_{11}$, $G_{21}$, $G_{52}$ and $G_{61}$ are open and the programmable logic control switches $G_{51}$ and $G_{31}$ are closed with $G_{32}$ closed to a proper bias $V_3$, and will remain in $C_3$. The signal charges stored in the storage element $C_3$ may be directed towards the storage element $C_1$ by keeping the programmable logic control switches $G_{52}$, $G_{21}$ and $G_{61}$ open and closing the programmable logic control switches $G_{11}$, $G_{31}$ and $G_{51}$ with $G_{32}$ closed to a proper bias $V_3$. As an alternative, the signal charges stored in the storage element $C_3$ may be directed towards the storage element $C_2$ by keeping the programmable logic control switches $G_{52}$, $G_{11}$ and $G_{61}$ open and closing the programmable logic control switches $G_{21}$, $G_{31}$ and $G_{51}$ with $G_{32}$ closed to a proper bias $V_3$. As another alternative, the signal charges stored in the storage element $C_3$ may be directed towards the storage element $C_4$ by keeping the programmable logic control switches $G_{11}$, $G_{21}$, $G_{52}$ and $G_{62}$ open and closing the programmable logic control switches $G_{31}$, $G_{41}$, $G_{51}$ and $G_{61}$ with $G_{32}$ closed to a proper bias $V_3$ and with $G_{42}$ closed to a proper bias $V_4$. Finally, the signal charges stored in the storage element $C_3$ may be directed towards an adjacent unit cell 165$_i$ or read out by keeping the programmable logic control switches $G_{62}$ and $G_{51}$ open and closing the programmable logic control switches $G_{52}$ and $G_{77}$ with $G_{32}$ closed to a proper bias $V_3$.

In a fourth non-limiting example, the signal charges may be subsequently stored in the storage element $C_4$ if the programmable logic control switches $G_{11}$, $G_{21}$, $G_{62}$ and $G_{51}$ are open and the programmable logic control switches $G_{61}$ and $G_{41}$ are closed with $G_{42}$ closed to a proper bias $V_4$, and will remain in $C_4$. The signal charges stored in the storage element $C_4$ may be directed towards the storage element $C_1$ by keeping the programmable logic control switches $G_{62}$, $G_{21}$ and $G_{51}$ open and closing the programmable logic control switches $G_{11}$, $G_{41}$ and $G_{61}$ with $G_{42}$ closed to a proper bias $V_4$. As an alternative, the signal charges stored in the storage element $C_4$ may be directed towards the storage element $C_2$ by keeping the programmable logic control switches $G_{62}$, $G_{11}$, and $G_{51}$ open and closing the programmable logic control switches $G_{21}$, $G_{41}$ and $G_{61}$ with $G_{42}$ closed to a proper bias $V_4$. As another alternative, the signal charges stored in the storage element $C_4$ may be directed towards the storage element $C_3$ by keeping the programmable logic control switches $G_{11}$, $G_{21}$, $G_{52}$ and $G_{62}$ open and closing the programmable logic control switches $G_{31}$, $G_{41}$, $G_{51}$ and $G_{61}$ with $G_{42}$ closed to a proper bias $V_4$ and with $G_{32}$ closed to a proper bias $V_3$. Finally, the signal charges stored in the storage element $C_4$ may subsequently be directed towards an adjacent unit cell 165$_i$ or read out by keeping the programmable logic control switches $G_{52}$ and $G_{61}$ open and closing the programmable logic control switches $G_{62}$ and $G_{77}$ with $G_{42}$ closed to a proper bias $V_4$.

The examples above demonstrate how the signal charges can be stored and directed to move through the example circuit topology of the individual unit cell 165$_i$ of FIG. 2A. Accordingly, a circuit topology comprising at least two storage elements $C_1$ and $C_2$ can enable signal charges received at a first temporal instance $T_1$ to be stored in the first storage element $C_1$ during a second temporal instance $T_2$ while signal charges received at the second temporal instance $T_2$ are directed to move or stored in a second storage element $C_2$. The signal charges stored in the first storage element $C_1$ may become a first operand and the signal charges present in the second storage element $C_2$ may become a second operand that can then be mathematically operated on to form a third operand.

Similarly, a circuit topology comprising at least three storage elements—a first storage element $C_1$, a second storage element $C_2$, and a third storage element $C_3$—can enable signal charges received at a first temporal instance $T_1$ to be stored in the first storage element $C_1$ during a second temporal instance $T_2$ while signal charges received at the second temporal instance $T_2$ are directed to move or stored in a second storage element $C_2$. The signal charges stored in the first storage element $C_1$ become a first operand and the signal charges present in the second storage element $C_2$ become a second operand that can then be mathematically operated on to form a third operand stored in the third storage element $C_3$.

Alternatively, a circuit topology comprising at least four storage elements—a first storage element $C_1$, a second storage element $C_2$, a third storage element $C_3$ and a fourth storage element $C_4$—can enable signal charges received at a first temporal instance $T_1$ to be stored in the first storage element $C_1$ during a second temporal instance $T_2$ while signal charges received at the second temporal instance $T_2$ are directed to move or stored in a second storage element $C_2$. The signal charges stored in the first storage element $C_1$ become a first operand and the signal charges present in the second storage element $C_2$ become a second operand that can then be mathematically operated on to form a third operand stored in the first storage element $C_1$, the second storage element $C_2$ or the fourth storage element $C_4$ at a third temporal instance $T_3$, during which a third set of signal charges are received and stored in the third storage element $C_3$. The signal charges stored in the third storage element $C_3$ become a fourth operand. The third operand and the fourth operand can then be mathematically operated on to form a fifth operand.

In some embodiments, the signal charges stored at multiple temporal instances $T_i$ can be temporarily stored and later operated on in a range of mathematical operations. The signal charges stored temporarily over a sequence of temporal instances $T_i$ may be rearranged in numerous ways to extract information from the incident infrared radiation. The mathematical operations may include, without limitation, determining whether a signal charge meets a threshold value, a summation of signal charges, determining a maximum value of signal charges, determining a difference of signal charges or determining an increasing or decreasing trend.

The addition of the signal charges stored in the first storage element $C_1$ and the second storage element $C_2$ of the individual unit cell $165_i$ may be accomplished by electrically connecting in parallel the storage elements $C_1$ and $C_2$, which enables voltage equalization and summation of the signal charges stored therein. The resultant voltage is the weighted average of signal charges stored in the storage elements $C_1$ and $C_2$ and can be analyzed, for example by measuring the gain of an amplifier electrically connected directly to the individual unit cell $165_i$, to find the summation of the signal charges.

Determining a difference of signal charges stored in the first storage element $C_1$ and the second storage element $C_2$ of the individual unit cell $165_i$ may be accomplished by reversing a polarity of the first storage element $C_1$ or the second storage element $C_2$ after the first storage element $C_1$ stores the signal charges directed thereto and the second storage element $C_2$ stores the signal charges directed thereto and then electrically connecting the first storage element $C_1$ in parallel to the second storage element $C_2$. In some embodiments such as shown in FIG. 2A, the reversal of polarity can be accomplished by proper bias control at the controllable voltage source $V_1$ and $V_2$ depending on whether the polarity of the first storage element $C_1$ or the polarity of the second storage element $C_2$ is reversed. In other embodiments, the reversal of polarity can be accomplished by sequential operation of a number of programmable logic control switches, as described below.

The above two mathematical operations combined allow a direct output of the "Luminance" and "Chrominance" in a two-color sensor operation and achieve histogram equalization if an additional gain amplifier is employed, circumventing many steps in external processing.

The capability to perform one or more mathematical operations is not limited to two operands and can extend to multiple operands derived from one or more mathematical operations or from signal charges received and stored at different temporal instances $T_i$ within the individual unit cell $165_i$. A time series analysis can thus be performed using the signal charges received over a plurality of temporal instances $T_i$, both for the individual unit cell $165_i$ as well as for the plurality of unit cells $165_i$ forming the ROIC 160.

While the examples above demonstrate only a few ways in which the signal charges stored in one or more storage elements $C_x$ can be controlled using one or more programmable logic control switches $G_{x1}$, $G_{x2}$, various other ways of controlling the stored signal charges within the individual unit cell $165_i$ as well as across different subsets of individual unit cells $165_i$ within the ROIC 160 are contemplated to be included within the scope and content of the disclosure. The embedded programmable gate array formed by the resultant combination of individual circuit modules $165_{ai}$ within the individual unit cell $165_i$ can be programmed through the temporal operation of a set of the programmable logic control switches $G=\{G_{00}, G_{11}, G_{12}, G_{21}, G_{22}, G_{31}, G_{32}, G_{41}, G_{42}, G_{51}, G_{52}, G_{61}, G_{62}, G_{77}, \ldots\}$ or a subset thereof within the individual unit cell $165_i$ as well as different subsets of individual unit cells $165_i$—representable by a three-dimensional matrix $P_i$ described above—within the ROIC 160. The storage and control of signal charges in the plurality of unit cells $165_i$ over the plurality of temporal instances $T_i$ thus advantageously enables moving frames of infrared images to be captured over a desired time of exposure to infrared radiation.

Various example embodiments of circuit modules $165_{ai}$ are now discussed below to demonstrate the possibilities for mathematically operating on the signal charges flowing into the individual unit cell $165_i$ of the ROIC 160.

Figure 3A:
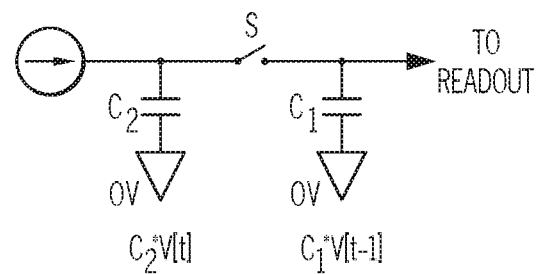
FIG. 3A depicts an example circuit module for implementing a temporal shifting of signal charges stored within the ROIC at different temporal instances, according to one or more embodiments shown and described herein.
Figure 3B:
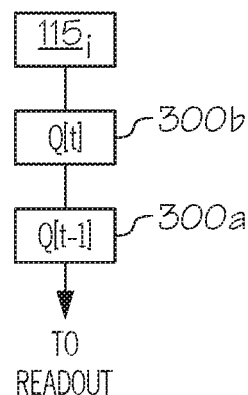
FIG. 3B depicts a flow diagram representing a function of the example circuit module of FIG. 3A, according to one or more embodiments shown and described herein.

FIG. 3A depicts an example circuit module 300 (implementable as the circuit module $165_{ai}$) for implementing a temporal shifting of signal charges stored within the ROIC 160 at different temporal instances $T_i$. FIG. 3B depicts a flow diagram representing a function of the example circuit module 300 of FIG. 3A. The example circuit module 300 includes a first storage element $C_1$ and a second storage element $C_2$ electrically connected through a programmable logic control switch S. The programmable logic control switch S can be operated to direct signal charges from the first storage element $C_1$ to the second storage element $C_2$. Thus signal charges received at a first temporal instance (t−1) can be stored in the first storage element $C_1$ and subsequently copied into the second storage element $C_2$ during a second temporal instance (t). The temporal instances (t−1) and (t) may be successive temporal instances. Accordingly, the signal charges stored in the first storage element $C_1$ at the first temporal instance (t−1) from the detector $115_i$ is Q(t−1), shown in box 300a. The signal charges directed into the second storage element $C_2$ at the second temporal instance (t) is Q(t), shown in box 300b. The signal charges Q(t−1) and Q(t) can be then read out, one at a time, from the individual unit cell $165_i$ to verify that Q(t−1)=Q(t).

Figure 4A:
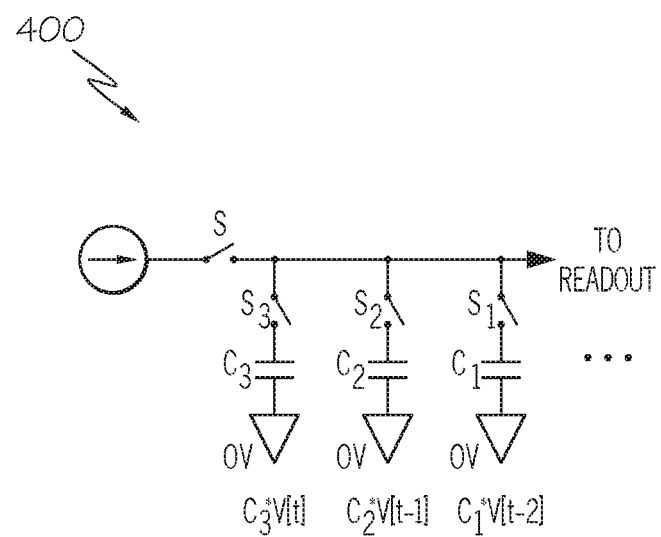
FIG. 4A depicts an example circuit module for determining a summation of signal charges stored within the ROIC at different temporal instances, according to one or more embodiments shown and described herein.
Figure 4B:
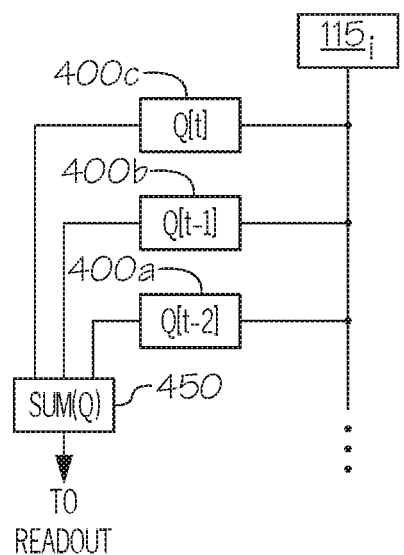
FIG. 4B depicts a flow diagram representing a function of the example circuit module of FIG. 4A, according to one or more embodiments shown and described herein.

FIG. 4A depicts an example circuit module 400 (implementable as the circuit module $165_{ai}$) for determining a summation 450 of signal charges stored within the ROIC 160 over different temporal instances $T_i$. FIG. 4B depicts a flow diagram representing a function of the example circuit module 400 of FIG. 4A. The example circuit module 400 includes three storage elements—a first storage element $C_1$, a second storage element $C_2$ and a third storage element $C_3$ situated in parallel. It should be understood that more than three storage elements may be provided in other embodiments of the example circuit module 400. A programmable logic control switch S is connected to the programmable logic control switches $S_1$, $S_2$ and $S_3$ for directing signal charges to the first storage element $C_1$ at a temporal instance (t−2), the second storage element $C_2$ at a temporal instance (t−1) and the third storage element $C_3$ at a temporal instance (t) respectively. The temporal instances (t−2), (t−1) and (t) may be successive temporal instances. Accordingly, the signal charges stored in the first storage element $C_1$ at the first temporal instance (t−2) from the detector $115_i$ is Q(t−2), shown in box 400a. The signal charges stored in the second storage element $C_2$ at the second temporal instance (t−1) from the detector $115_i$ is Q(t−1), shown in box 400b. The signal charges stored in the third storage element $C_3$ at the third temporal instance (t) from the detector $115_i$ is Q(t), shown in box 400c. When the first storage element $C_1$, the second storage element $C_2$ and the third storage element $C_3$ are electrically connected in parallel, the resultant voltage is the weighted average voltage representing the summation 450 of the signal charges Q(t−2), Q(t−1), and Q(t), SUM (Q)=[Q(t−2)+Q(t−1)+Q(t)].

Figure 5A:
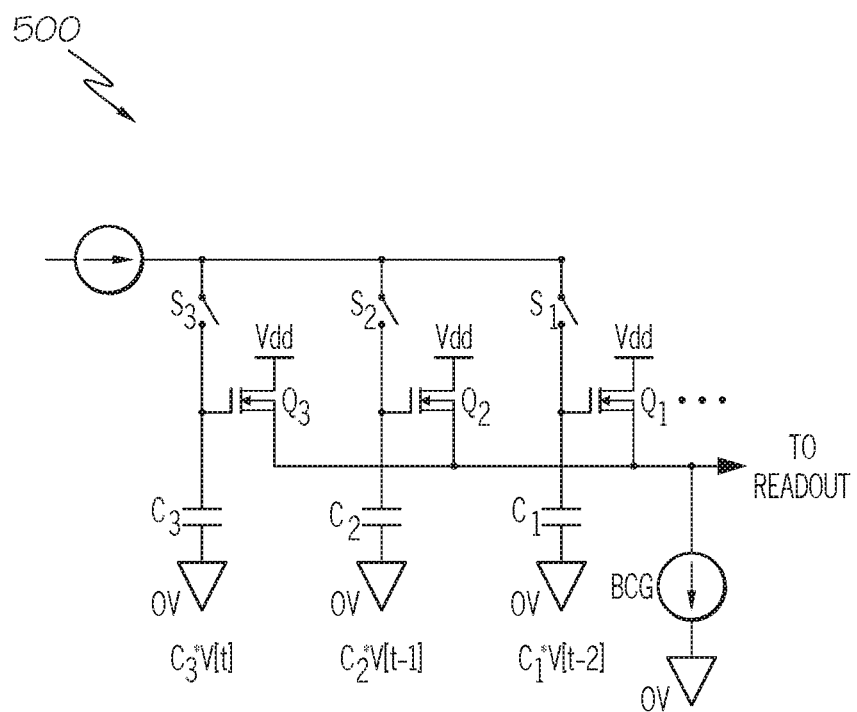
FIG. 5A depicts an example circuit module for determining a maximum value of signal charges stored within the ROIC at different temporal instances, according to one or more embodiments shown and described herein.
Figure 5B:
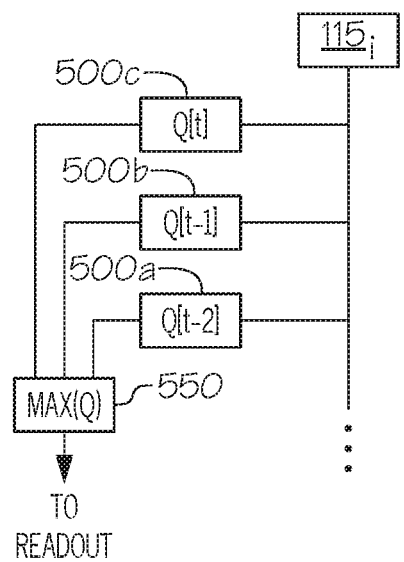
FIG. 5B depicts a flow diagram representing a function of the example circuit module of FIG. 5A, according to one or more embodiments shown and described herein.

FIG. 5A depicts an example circuit module 500 (implementable as the circuit module $165_{ai}$) for determining a maximum value 550 of signal charges stored within the ROIC 160 over different temporal instances $T_i$. FIG. 5B depicts a flow diagram representing a function of the example circuit module 500 of FIG. 5A. The example circuit module 500 includes three storage elements—a first storage element $C_1$, a second storage element $C_2$ and a third storage element $C_3$ situated in parallel. It should be understood that more or fewer storage elements may be provided in the example circuit module 500. A first programmable logic control switch $S_1$ is switchably connected to the first storage element $C_1$ storing signal charges at a temporal instance (t−2). The voltage developed across the first storage element $C_1$ due to signal charges is applied to a metal-oxide-semiconductor-field-effect-transistor (MOSFET) amplifier $Q_1$, which is configured as a source-follower amplifier in conjunction with the output bias current generator BCG. A second programmable logic control switch $S_2$ is switchably connected to the second storage element $C_2$ storing signal charges at a temporal instance (t−1) and the voltage is applied to a MOSFET amplifier $Q_2$. A third programmable logic control switch $S_3$ is switchably connected to the third storage element $C_3$ storing signal charges at a temporal instance (t) and the voltage is applied to a MOSFET amplifier $Q_3$. The temporal instances (t−2), (t−1) and (t) may be successive temporal instances. Accordingly, the signal charges stored in the first storage element $C_1$ at the first temporal instance (t−2) from the detector $115_i$ is Q(t−2), shown in box 500a. The signal charges stored in the second storage element $C_2$ at the second temporal instance (t−1) from the detector $115_i$ is Q(t−1), shown in box 500b. The signal charges stored in the third storage element $C_3$ at the third temporal instance (t) from the detector $115_i$ is Q(t), shown in box 500c. Each output of source-follower amplifiers $Q_1$, $Q_2$ and $Q_3$ is applied to a common bias current connection through the bias current generator BCG so that only the amplifier with the largest input voltage will conduct current and thereby indicate the output voltage, which represents the maximum value 550 of the signal charges stored in the storage elements $C_1$, $C_2$ and $C_3$, MAX(Q) =maximum value {Q(t−2), Q(t−1), Q(t)}.

As a non-limiting example, a combination of the example circuit module 400 and the example circuit module 500 can be used to determine a maximum value of either the present value of signal charges residing in the third storage element $C_3$ or the average of past values of signal charges in the second storage element $C_2$ and the first storage element $C_1$ stored at the successive temporal instances (t−1) and (t−2) respectively. The first storage element $C_1$ and the second storage element $C_2$ storing signal charges at the successive temporal instances (t−2) and (t−1) respectively are first electrically connected in parallel prior to reading the combined source-follower amplifier output.

Figure 6A:
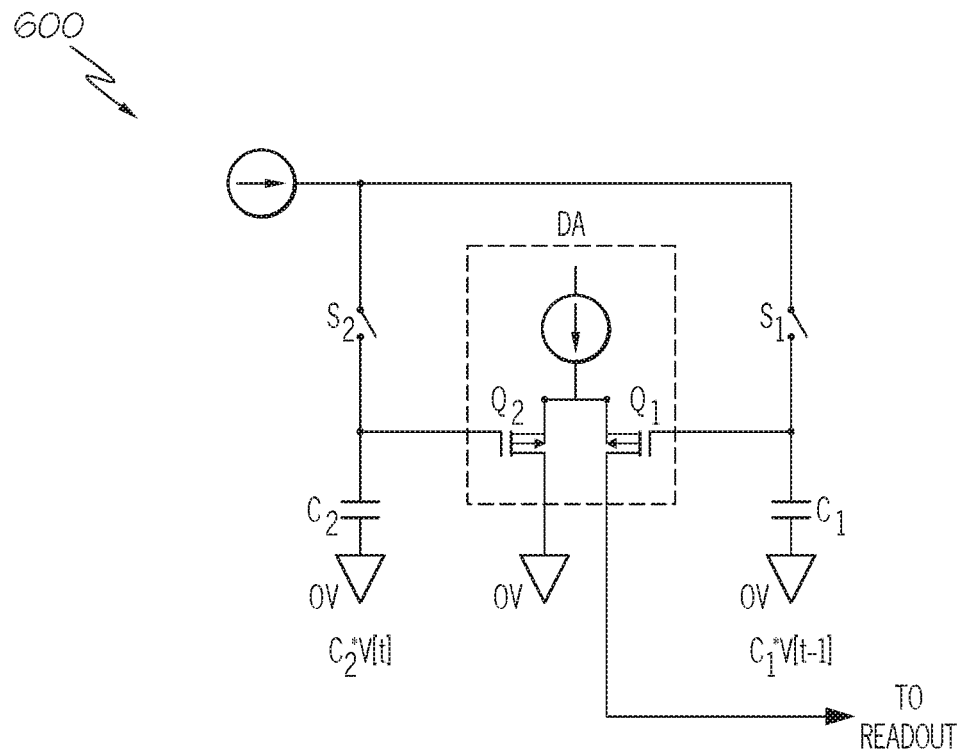
FIG. 6A depicts an example circuit module for determining an increasing or decreasing trend of signal charges stored within the ROIC at different temporal instances, according to one or more embodiments shown and described herein.
Figure 6B:
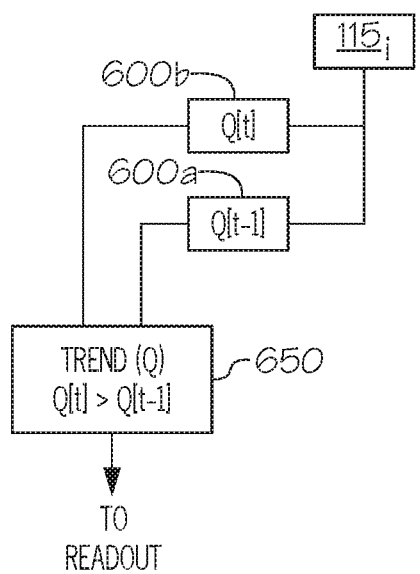
FIG. 6B depicts a flow diagram representing a function of the example circuit module of FIG. 6A, according to one or more embodiments shown and described herein.

FIG. 6A depicts an example circuit module 600 (implementable as the circuit module $165_{ai}$) for determining an increasing or decreasing trend 650 of signal charges stored within the ROIC 160 over different temporal instances $T_i$. FIG. 6B depicts a flow diagram representing a function of the example circuit module 600 of FIG. 6A. The example circuit module 600 includes two storage elements—a first storage element $C_1$ and a second storage element $C_2$ situated in parallel. A first programmable logic control switch $S_1$ is electrically connected to the first storage element $C_1$ storing signal charges at a temporal instance (t−1), while a second programmable logic control switch $S_2$ is electrically connected to the second storage element $C_2$ storing signal charges at a temporal instance (t). The temporal instances (t−1) and (t) may be successive temporal instances. Accordingly, the signal charges stored in the first storage element $C_1$ at the temporal instance (t−1) from the detector $115_i$ is Q(t−1), shown in box 600a. The signal charges stored in the second storage element $C_2$ at the second temporal instance (t) from the detector $115_i$ is Q(t), shown in box 600b. Each of the first storage element $C_1$, and the second storage element $C_2$ are electrically connected to a differential comparator circuit DA (e.g., through a MOSFET switch $Q_1$ and a MOSFET switch $Q_2$ respectively) to determine a trend 650 whether signal charges stored in the second storage element $C_2$ at a second temporal instance (t) is increasing or decreasing in comparison to signal charges stored in the first storage element $C_1$ at a first temporal instance (t−1), TREND(Q)= [Q(t)>Q(t−1)].

Figure 7A:
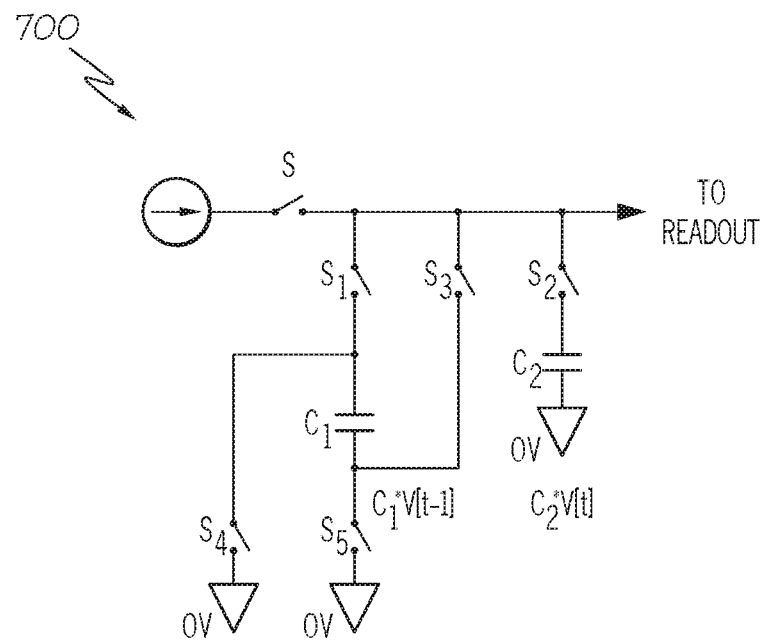
FIG. 7A depicts an example circuit module for determining a difference of signal charges stored within the ROIC at different temporal instances, according to one or more embodiments shown and described herein.
Figure 7B:
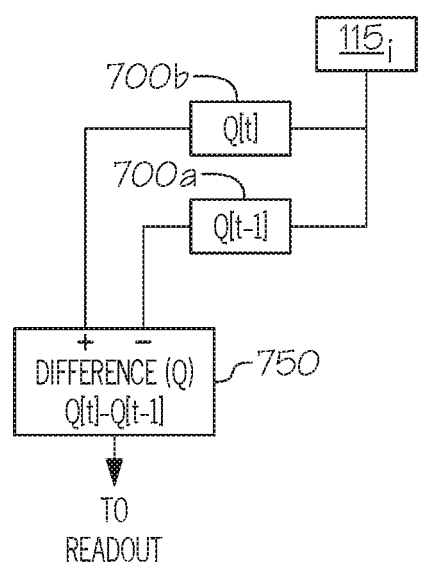
FIG. 7B depicts a flow diagram representing a function of the example circuit module of FIG. 7A, according to one or more embodiments shown and described herein.

FIG. 7A depicts an example circuit module 700 (implementable as the circuit module $165_{ai}$) for determining a difference 750 of signal charges stored within the ROIC 160 at different temporal instances $T_i$. FIG. 7B depicts a flow diagram representing a function of the example circuit module 700 of FIG. 7A. The example circuit module 700 includes two storage elements—a first storage element $C_1$ and a second storage element $C_2$ situated in parallel. A programmable logic control switch S is connected to the programmable logic control switches $S_1$ and $S_2$ for directing signal charges to the first storage element $C_1$ at a temporal instance (t−1) and the second storage element $C_2$ at a temporal instance (t) respectively. The temporal instances (t−1) and (t) may be successive temporal instances. The first storage element $C_1$ is electrically connected to programmable logic control switches $S_1$, $S_4$ at one end and $S_3$, $S_5$ at the other end. The programmable logic control switch $S_3$ electrically connects the first storage element $C_1$ to the second storage element $C_2$, which is also electrically connected through another programmable logic control switch $S_2$. Accordingly, the signal charges stored in the first storage element $C_1$ at the temporal instance (t−1) from the detector $115_i$ is Q(t−1), shown in box 700a. The signal charges stored in the second storage element $C_2$ at the second temporal instance (t) from the detector $115_i$ is Q(t), shown in box 700b. A difference 750 of the signal charges stored in the first storage element $C_1$ at the temporal instance (t−1) and the signal charges stored in the second storage element $C_2$ at the temporal instance (t) can be determined by first reversing the polarity of the first storage element $C_1$ and then electrically connecting the first storage element $C_1$ in parallel to the second storage element $C_2$. The reversal of polarity can be accomplished by ordered operations of the programmable logic control switches $S_1$, $S_2$, $S_3$, $S_4$ and $S_5$. For example, after the programmable logic control switches S, $S_1$ and $S_5$ are closed and the programmable logic control switches $S_3$ and $S_4$ are open, the signal charges flow into the first storage element $C_1$. Subsequently, the programmable logic control switches $S_4$ and $S_3$ are closed and the programmable logic control switches $S_1$ and $S_5$ are opened to reverse the polarity of the signal charges in the first storage element $C_1$ such that when the first storage element $C_1$ is electrically connected in parallel to the second storage element $C_2$, the difference 750 of the signal charges is thus DIFFERENCE(Q)=[Q(t)−Q (t−1)].

Though not shown in FIG. 7A, the difference 750 may be also determined by first reversing the polarity of second first storage element $C_2$ before electrically connecting the first storage element $C_1$ in parallel to the second storage element $C_2$. The reversal of polarity, in that case, can be accomplished by ordered operations of the programmable logic control switches $S_1$, $S_2$, $S_3$, $S_4$ and $S_5$ connected to the second storage element $C_2$ in a similar way as shown in FIG. 7A with respect to the first storage element $C_1$.

Figure 8A:
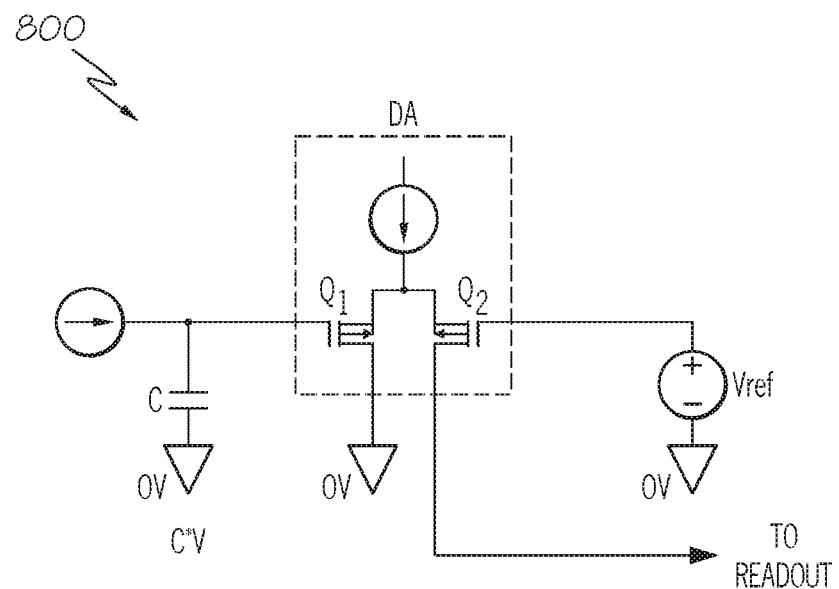
FIG. 8A depicts an example circuit module for determining a comparison of signal charges stored within the ROIC to a threshold value, according to one or more embodiments shown and described herein.
Figure 8B:
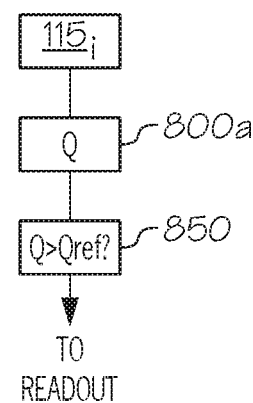
FIG. 8B depicts a flow diagram representing a function of the example circuit module of FIG. 8A, according to one or more embodiments shown and described herein.

FIG. 8A depicts an example circuit module 800 (implementable as the circuit module $165_{ai}$) for determining a comparison 850 of signal charges stored within the ROIC 160 to a threshold value at any temporal instance $T_i$. FIG. 8B depicts a flow diagram representing a function of the example circuit module 800 of FIG. 8A. The example circuit module 800 includes a storage element C electrically connected to an external reference voltage $V_{ref}$ through a differential comparator circuit DA. The storage element C is electrically connected to a MOSFET switch $Q_1$ of the differential comparator circuit DA while the external reference voltage $V_{ref}$ is electrically connected to a MOSFET switch $Q_2$ of the differential comparator circuit DA. This arrangement is used for illustrative purposes only and the circuit elements can be differently connected in different embodiments. Accordingly, the signal charges Q stored in the storage element C at any temporal instance $T_i$ from the detector $115_i$, shown in box 800a, can be compared with a threshold value $Q_{ref}$ corresponding to the external reference voltage $V_{ref}$, to determine, in step 850, if the signal charges Q meets the threshold value $Q_{ref}$, i.e. whether $Q > Q_{ref}$. The example circuit module 800 in FIG. 8A can thus be used to determine whether the signal charges stored in an individual unit cell $165_i$ or one or more subsets of individual unit cells $165_i$ meets a threshold value by electrically connecting a storage element storing the signal charges and an external reference voltage $V_{ref}$ corresponding to the threshold value through the differential comparator circuit DA.

A combination of one or more of the circuit modules 300, 400, 500, 600, 700, and 800 are implementable as the circuit modules $165_{ai}$ within the individual unit cell $165_i$. Moreover, the circuit topologies inherent in the circuit modules 300, 400, 500, 600, 700, and 800 are equally applicable for operating signal charges across any subset of adjacent unit cells within the ROIC 160. The circuit topologies inherent in the circuit modules 300, 400, 500, 600, 700, and 800 are also applicable across at least two subsets of adjacent unit cells $165_i$. In some embodiments, the at least two subsets may form the entire plurality of unit cells $165_i$ in the ROIC 160. In some embodiments, individual subsets of the at least two subsets of adjacent unit cells have an equal number of adjacent unit cells. In some embodiments, the individual subsets of the at least two subsets of adjacent unit cells have an equal number of adjacent unit cells and they together form the entire plurality of unit cells $165_i$ in the ROIC 160. In all embodiments involving one or more subsets of adjacent unit cells, one or more additional programmable logic control switches may be coupled across the one or more subsets of adjacent unit cells within the ROIC 160 to achieve desired circuit topologies.

Figure 9A:
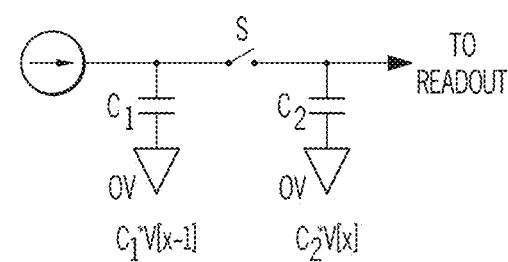
FIG. 9A depicts an example circuit module for implementing a spatial shifting of signal charges stored across different unit cells within the ROIC, according to one or more embodiments shown and described herein.
Figure 9B:
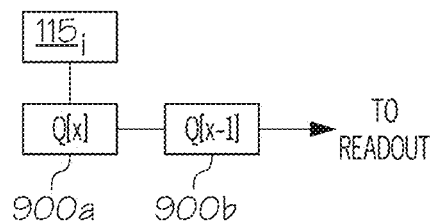
FIG. 9B depicts a flow diagram representing a function of the example circuit module of FIG. 9A, according to one or more embodiments shown and described herein.

FIG. 9A depicts an example circuit module 900 for implementing a spatial shifting of signal charges stored across different unit cells $165_i$ within the ROIC 160. FIG. 9B depicts a flow diagram representing a function of the example circuit module 900 of FIG. 9A. The example circuit module 900 includes a first storage element $C_1$ in a first unit cell $165_{i(x-1)}$ and a second storage element $C_2$ in a second unit cell $165_{ix}$ electrically connected through a programmable logic control switch S. The first unit cell $165_{i(x-1)}$ and the second unit cell $165_{ix}$ may be adjacent unit cells, or unit cells that are separated by other intervening unit cells. The programmable logic control switch S can be operated to direct signal charges from the first storage element $C_1$ to the second storage element $C_2$. Thus signal charges received by the first unit cell $165_{i(x-1)}$ can be stored in the first storage element $C_1$ and subsequently copied into the second storage element $C_2$ in the second unit cell $165_{ix}$. Accordingly, the signal charges stored in the first storage element $C_1$ in the first unit cell $165_{i(x-1)}$ from the detector $115_i$ is $Q(x-1)$, shown in box 900a. The signal charges directed into the second storage element $C_2$ in the second unit cell $165_{ix}$ is $Q(x)$, shown in box 900b. The signal charges $Q(x-1)$ and $Q(x)$ can be then read out, one at a time, from the second unit cell $165_{ix}$, to verify that $Q(x-1)=Q(x)$.

Figure 10A:
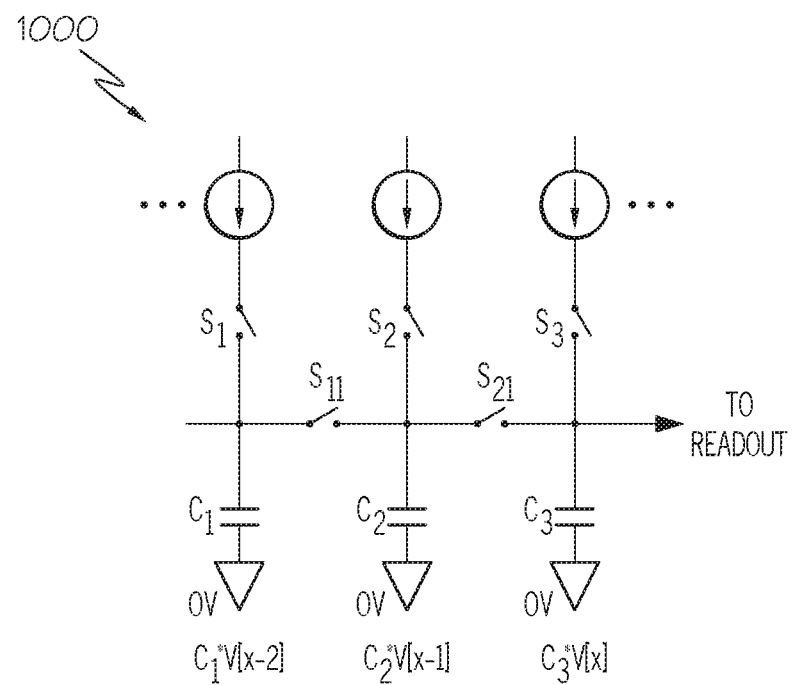
FIG. 10A depicts an example circuit module for determining a summation of signal charges stored across different unit cells within the ROIC, according to one or more embodiments shown and described herein.
Figure 10B:
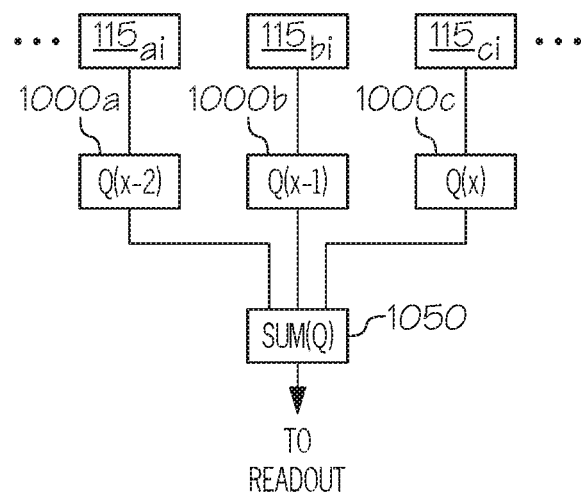
FIG. 10B depicts a flow diagram representing a function of the example circuit module of FIG. 9A, according to one or more embodiments shown and described herein.

FIG. 10A depicts an example circuit module 1000 for determining a summation of signal charges stored across different unit cells $165_i$ within the ROIC 160. FIG. 10B depicts a flow diagram representing a function of the example circuit module 1000 of FIG. 10A. The example circuit module 1000 includes three storage elements situated in parallel—a first storage element $C_1$ in a first unit cell $165_{i(x-2)}$, a second storage element $C_2$ in a second unit cell $165_{i(x-1)}$ and a third storage element $C_3$ in a third unit cell $165_{ix}$. It should be understood that the example circuit module 1000 is not limited to the embodiment shown in FIG. 10A and may contain more or fewer unit cells $165_i$. The unit cells $165_{i(x-2)}$, $165_{i(x-1)}$ and $165_{ix}$ may be adjacent unit cells, or unit cells that are separated by other intervening unit cells. The first storage element $C_1$ is electrically connected to the second storage element $C_2$ through a programmable logic control switch $S_{11}$. The second storage element $C_2$ is electrically connected to the third storage element $C_3$ through a programmable logic control switch $S_{21}$. Signal charges from detectors $115_{ai}$, $115_{bi}$ and $115_{ci}$ are directed by the programmable logic control switches $S_1$, $S_2$ and $S_3$ to the first storage element $C_1$, the second storage element $C_2$ and the third storage element $C_3$ respectively. Accordingly, the signal charges stored in the first storage element $C_1$ is $Q(x-2)$, shown in box 1000a. The signal charges stored in the second storage element $C_2$ is $Q(x-1)$, shown in box 1000b. The signal charges stored in the third storage element $C_3$ is $Q(x)$, shown in box 1000c. When the first storage element $C_1$, the second storage element $C_2$ and the third storage element $C_3$ are electrically connected in parallel, the resultant voltage is the weighted average voltage representing the summation 1050 of the signal charges $Q(x-2)$, $Q(x-1)$, and $Q(x)$, $SUM(Q)=[Q(x-2)+Q(x-1)+Q(x)]$.

Figure 11A:
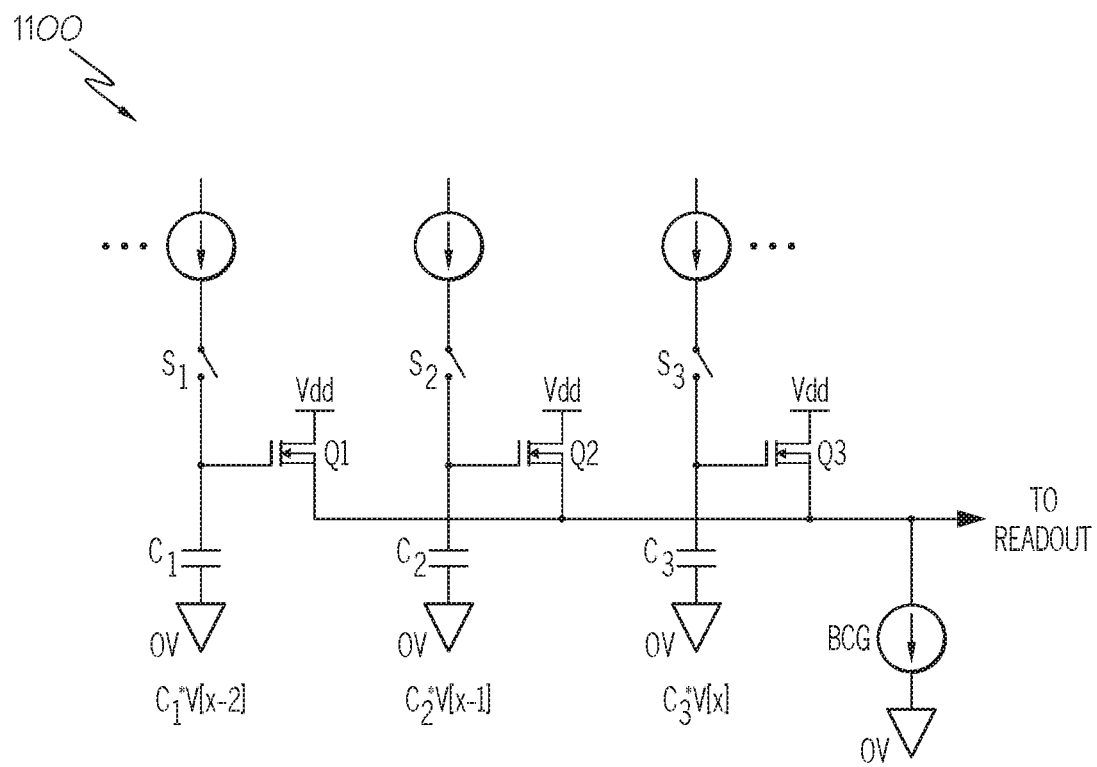
FIG. 11A depicts an example circuit module for determining a maximum value of signal charges stored across different unit cells within the ROIC, according to one or more embodiments shown and described herein.
Figure 11B:
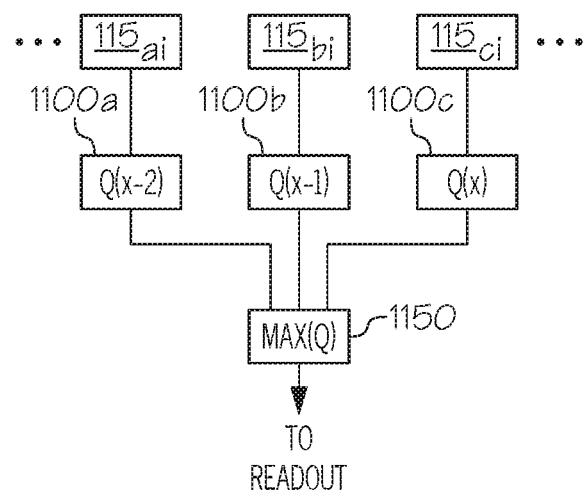
FIG. 11B depicts a flow diagram representing a function of the example circuit module of FIG. 10A, according to one or more embodiments shown and described herein.

FIG. 11A depicts an example circuit module 1100 for determining a maximum value 1150 of signal charges stored across different unit cells within the ROIC 160. FIG. 11B depicts a flow diagram representing a function of the example circuit module 1100 of FIG. 11A. The example circuit module 1100 includes three storage elements situated in parallel—a first storage element $C_1$ in a first unit cell $165_{i(x-2)}$, a second storage element $C_2$ in a second unit cell $165_{i(x-1)}$ and a third storage element $C_3$ in a third unit cell $165_{ix}$. It should be understood that the example circuit module 1100 is not limited to the embodiment shown in FIG. 11A and may contain more or fewer unit cells $165_i$. The unit cells $165_{i(x-2)}$, $165_{i(x-1)}$ and $165_{ix}$ may be adjacent unit cells, or unit cells that are separated by other intervening unit cells. A first programmable logic control switch $S_1$ is switchably connected to the first storage element $C_1$. The voltage developed across $C_1$ due to signal charges is applied to a metal-oxide-semiconductor-field-effect-transistor (MOSFET) $Q_1$, which is configured as a source-follower amplifier in conjunction with the output bias current generator BCG. It should be understood that other switching devices may be utilized instead. A second programmable logic control switch $S_2$ is switchably connected to the second storage element $C_2$ and the voltage is applied to MOSFET amplifier $Q_2$. A third programmable logic control switch $S_3$ is switchably connected to the third storage element $C_3$ and the voltage is applied to MOSFET amplifier $Q_3$. Signal charges from detectors $115_{ai}$, $115_{bi}$ and $115_{ci}$ are directed by the programmable logic control switches $S_1$, $S_2$ and $S_3$ to the first storage element $C_1$ in the first unit cell $165_{i(x-2)}$, the second storage element $C_2$ in the second unit cell $165_{i(x-1)}$ and the third storage element $C_3$ in the third unit cell $165_{ix}$ respectively. Accordingly, the signal charges stored in the first storage element $C_1$ is $Q(x-2)$, shown in box 1100a. The signal charges stored in the second storage element $C_2$ is $Q(x-1)$, shown in box 1100b. The signal charges stored in the third storage element $C_3$ is $Q(x)$, shown in box 1100c. Each output of source-follower amplifiers $Q_1$, $Q_2$ and $Q_3$ is applied to a common bias current connection through the bias current generator BCG so that only the amplifier with the largest input voltage will conduct current and thereby indicate the output voltage, which represents the maximum value 1150 of the signal charges stored in the storage elements $C_1$, $C_2$ and $C_3$, $MAX(Q)$=maximum value $\{Q(x-2), Q(x-1), Q(x)\}$.

Figure 12A:
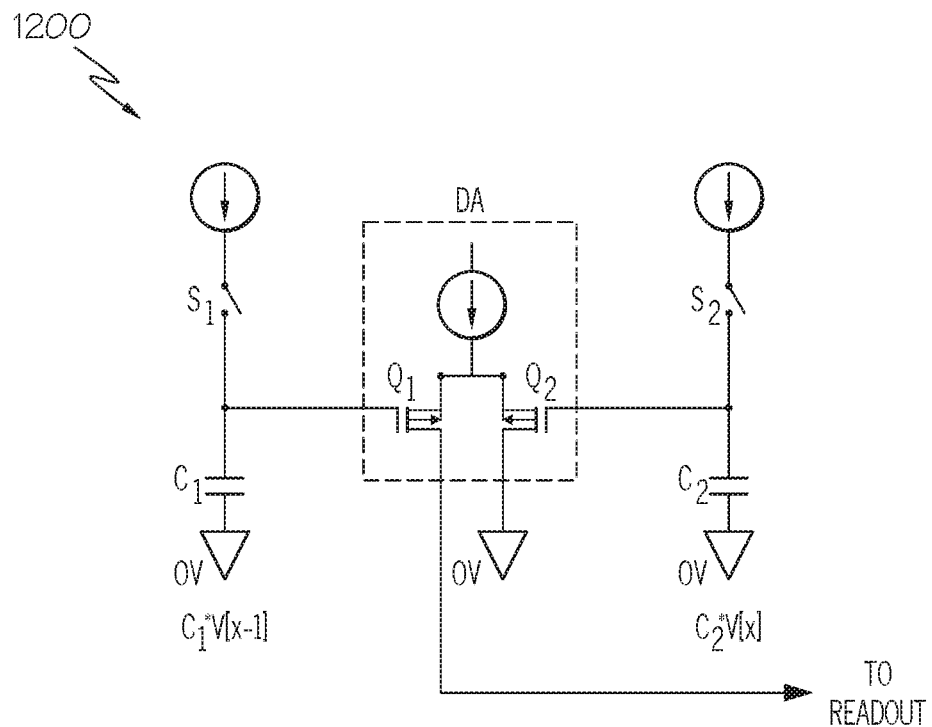
FIG. 12A depicts an example circuit module for determining an increasing or decreasing trend of stored signal charges across different unit cells within the ROIC, according to one or more embodiments shown and described herein.
Figure 12B:
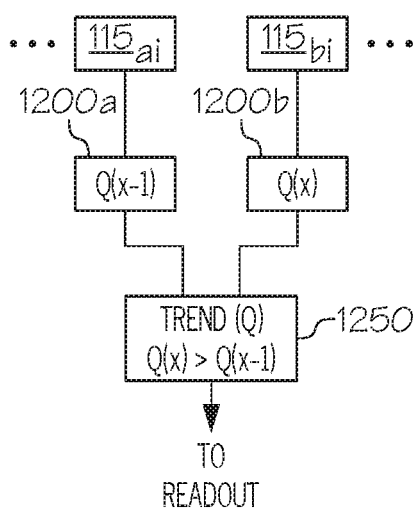
FIG. 12B depicts a flow diagram representing a function of the example circuit module of FIG. 11A, according to one or more embodiments shown and described herein.

FIG. 12A depicts an example circuit module 1200 for determining an increasing or decreasing trend 1250 of signal charges stored across different unit cells within the ROIC 160. FIG. 12B depicts a flow diagram representing a function of the example circuit module 1200 of FIG. 12A. The example circuit module 1200 includes two storage elements situated in parallel—a first storage element $C_1$ in a first unit cell $165_{i(x-1)}$ and a second storage element $C_2$ in a second unit cell $165_{ix}$. The unit cells $165_{i(x-1)}$ and $165_{ix}$ may be adjacent unit cells, or unit cells that are separated by other intervening unit cells. A first programmable logic control switch $S_1$ is electrically connected to the first storage element $C_1$, while a second programmable logic control switch $S_2$ is electrically connected to the second storage element $C_2$. Signal charges from detectors $115_{ai}$ and $115_{bi}$ are directed by the programmable logic control switches $S_1$ and $S_2$ to the first storage element $C_1$ in the first unit cell $165_{i(x-1)}$ and the second storage element $C_2$ in the second unit cell $165_{ix}$ respectively. Accordingly, the signal charges stored in the first storage element $C_1$ is $Q(x-1)$, shown in box 1200a. The signal charges stored in the second storage element $C_2$ is $Q(x)$, shown in box 1200b. Each of the first storage element $C_1$ and the second storage element $C_2$ are electrically connected to a differential comparator circuit DA (e.g. through a MOSFET switch $Q_1$ and a MOSFET switch $Q_2$ respectively) to determine a trend 1250 whether signal charges stored in the second storage element $C_2$ is increasing or decreasing in comparison to signal charges stored in the first storage element $C_1$, $TREND(Q)=[Q(x)>Q(x-1)]$.

Figure 13A:
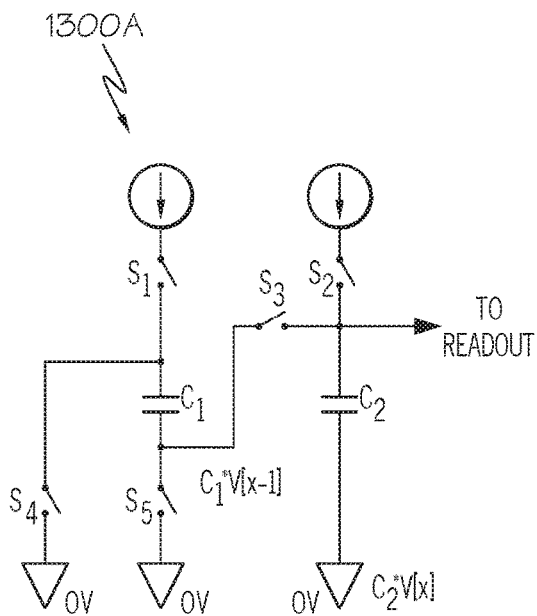
FIG. 13A depicts a first example circuit module for determining a difference of signal charges stored across different unit cells within the ROIC, according to one or more embodiments shown and described herein.
Figure 13B:
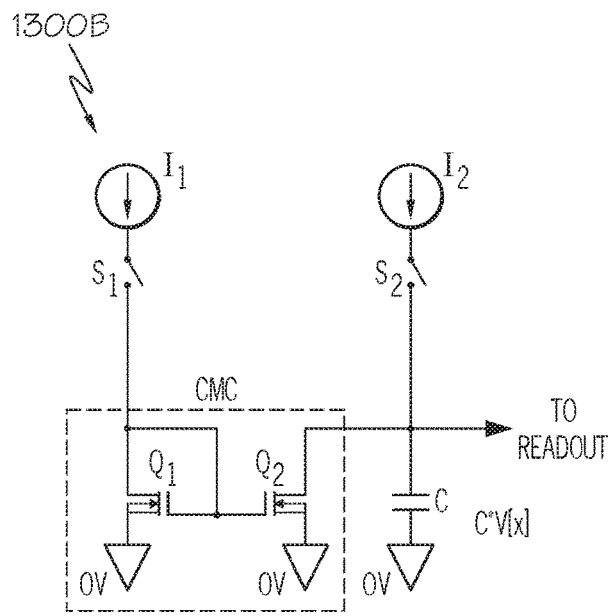
FIG. 13B depicts a second example circuit module for determining a difference of signal charges stored across different unit cells within the ROIC, according to one or more embodiments shown and described herein.
Figure 13C:
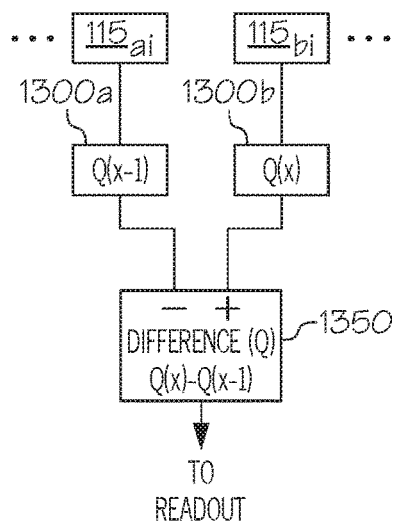
FIG. 13C depicts a flow diagram representing a function of the example circuit modules of FIGS. 13A-13B, according to one or more embodiments shown and described herein.

FIG. 13A depicts a first example circuit module 1300A and FIG. 13B depicts a second example circuit module 1300B for determining a difference 1350 of signal charges stored across different unit cells within the ROIC 160. FIG. 13C depicts a flow diagram representing a function of the example circuit modules 1300A, 1300B of FIGS. 13A-13B. The example circuit module 1300A includes two storage elements situated in parallel—a first storage element $C_1$ in a first unit cell $165_{i(x-1)}$ and a second storage element $C_2$ in a second unit cell $165_{ix}$. The unit cells $165_{i(x-1)}$ and $165_{ix}$ may be adjacent unit cells, or unit cells that are separated by other intervening unit cells. The first storage element $C_1$ is electrically connected to programmable logic control switches $S_1$, $S_4$ at one end and $S_3$, $S_5$ at the other end. The programmable logic control switch $S_3$ electrically connects the first storage element $C_1$ to the second storage element $C_2$, which is also electrically connected through another programmable logic control switch $S_2$. Signal charges from detectors $115_{ai}$ and $115_{bi}$ are directed by the programmable logic control switches $S_1$ and $S_2$ to the first storage element $C_1$ and the second storage element $C_2$ respectively. Accordingly, the signal charges stored in the first storage element $C_1$ is $Q(x-1)$, shown in box 1300a. The signal charges stored in the second storage element $C_2$ is $Q(x)$, shown in box 1300b. A difference 1350 of the signal charges stored in the first storage element $C_1$ and in the second storage element can be determined by first reversing the polarity of the first storage element $C_1$ and then electrically connecting the first storage element $C_1$ in parallel to the second storage element $C_2$. The reversal of polarity can be accomplished by ordered operations of the programmable logic control switches $S_1$, $S_2$, $S_3$, $S_4$ and $S_5$. For example, after the programmable logic control switches $S_1$ and $S_5$ are closed and the programmable logic control switches $S_3$ and $S_4$ are open, the signal charges flow into the first storage element $C_1$. Subsequently, the programmable logic control switches $S_4$ and $S_3$ are closed and the programmable logic control switches $S_1$ and $S_5$ are opened to reverse the polarity of the signal charges in the first storage element $C_1$ such that when the first storage element $C_1$ is electrically connected in parallel to the second storage element $C_2$, the difference 1350 of the signal charges is thus $DIFFERENCE(Q)=[Q(x)-Q(x-1)]$.

Alternatively, the example circuit module 1300B (shown in FIG. 13B) may be used for determining a difference 1350 of signal charges stored across different unit cells within the ROIC 160. The example circuit module 1300B includes a current mirror circuit CMC electrically connected to the first unit cell $165_{i(x-1)}$ and a storage element C in a second unit cell $165_{ix}$. The unit cells $165_{i(x-1)}$ and $165_{ix}$ may be adjacent unit cells, or unit cells that are separated by other intervening unit cells. Signal charges from the detector $115_{ai}$ are directed by the programmable logic control switch $S_1$ to the input of the current mirror circuit CMC for replicating a negative value of a flow of signal charges, $I_1$, through the first unit cell $165_{i(x-1)}$. This negative replica, $-I_1$, of the flow of signal charges in the first unit cell $165_{i(x-1)}$ is then directed to the storage element C in the second unit cell $165_{ix}$. Simultaneously a flow of signal charges, $I_2$, from the detector $115_{bi}$ are also directed by the programmable logic control switch $S_2$ to the storage element C in the second unit cell $165_{i(x-1)}$. Accordingly, the difference 1350 of the signal charges from detectors $115_{ai}$ and $115_{bi}$ is stored in the storage element C and can be thus determined as $DIFFERENCE(Q)=C*V(x)=\int(I_2-I_1)dt$.

As a matter of general principle, the embodiments described herein and their combinations can be utilized to effectively control the flow of signal charges within one or more individual unit cells $165_i$ comprising the ROIC 160. The programmable logic control switches in one or more individual unit cells $165_i$ can be operably configured such that when a first storage element $C_1$ in a first unit cell $165_{a1}$ stores a first set of signal charges received at a first temporal instance $T_1$, at least one second storage element $C_2$ in the first unit cell $165_{a1}$ or a second unit cell $165_{a2}$ stores a second set of signal charges received at at least one second temporal instance $T_2$.

The programmable logic control switches in one or more individual unit cells $165_i$ can be operably configured to determine a summation of signal charges stored in the one or more individual unit cells $165_i$ over a plurality of temporal instances $T_i$ by electrically connecting in parallel the first storage element $C_1$ in the first unit cell $165_{a1}$ and the at least one second storage element $C_2$ in the first unit cell $165_{a1}$ or the second unit cell $165_{a2}$.

The programmable logic control switches in one or more individual unit cells $165_i$ can be operably configured to determine a difference of signal charges stored within the one or more individual unit cells $165_i$ by reversing a polarity of the first storage element $C_1$ or the at least one second storage element $C_2$ after the first storage element $C_1$ stores the first set of signal charges received at the first temporal instance $T_1$ and the at least one second storage element $C_2$ stores the second set of signal charges at the second temporal instance $T_2$ but before the first storage element $C_1$ is electrically connected in parallel with the at least one second storage element $C_2$.

The programmable logic control switches in one or more individual unit cells $165_i$ can be operably configured to determine a maximum value of signal charges stored over the plurality of temporal instances $T_i$ by electrically connecting the first storage element $C_1$ to a first source-follower amplifier and the at least one second storage element $C_2$ to a second source-follower amplifier through a common bias current connection.

The programmable logic control switches in one or more individual unit cells $165_i$ can be operably configured to determine whether the second set of signal charges stored in the at least one second storage element $C_2$ is increasing or decreasing in comparison to the first set of signal charges stored in the first storage element $C_1$ by electrically connecting the first storage element $C_1$ and the at least one second storage element $C_2$ to a differential comparator circuit.

Accordingly, in some embodiments, subsets of 2×2 unit cells $165_i$ can be designed with programmable logic control switches and storage elements shared by all four unit cells $165_i$, enabling that subset of 2×2 unit cells $165_i$ to be further programmed for mathematical operations. The signal charges received by all four unit cells $165_i$ at the same temporal instance $T_i$ can be added as a sum to boost noise performance. The signal charges received by any one unit cell $165_i$ can be subtracted from those received at the same temporal instance $T_i$ by one or more unit cells $165_i$ in the subset to improve unresolved target detection.

In some embodiments, one or more programmable logic control switches are configured to achieve time-delay-integration (TDI), especially for motion-related signal-starving applications. The one or more programmable logic control switches are coupled across one or more subsets of adjacent unit cells $165_i$ by electrically connecting in parallel one or more storage elements $C_x$ across the one or more subsets of adjacent unit cells $165_i$ at successive temporal instances $T_i$. Thus, the signal charges received in a first storage element $C_1$ in a first unit cell $165_1$ at a first temporal instance $T_1$ are added to the signal charges received in a second storage element $C_2$ in a second unit cell $165_2$, adjacent to the first unit cell $165_1$, at a second temporal instance $T_2$, and so on. It is further contemplated that with real-time reprogramming based on properly coordinated metadata from external sources, TDI can be done efficiently in and around localized areas of the images of a moving target without the need to extend to the entire field-of-view (FOV) of the detector array 110.

Additionally, it is contemplated that in some embodiments, the detector array 110 may be coupled to a diffractive-filter array. In such embodiments, the one or more programmable logic control switches in the individual unit cell $165_i$ can be additionally programmed to form spectral combs to identify and extract spectral signature information of an individual photon corresponding to an individual signal charge stored in the one or more storage elements $C_x$ of the individual unit cell $165_i$. Accordingly, the ROIC 160 is configured to extract multi-signature (spectral, temporal and spatial) data.

The embodiments described herein can be advantageously used for the design and operation of multi-function ROICs that enable programmable controls of how information from infrared radiation is received, stored, and conveniently extracted for subsequent production of infrared images. Many application-driven matrix operations can be achieved by first designing a selected set of storage elements in the ROIC coupled to another selected set of corresponding programmable logic control switches and then programming the set of programmable logic control switches to execute a sequence of operations over a period of time, to extract information-enriched data at or near the point of incidence of the infrared radiation. The extraction of information-enriched data and the subsequent processing through mathematical operations in the analog domain within the ROIC offers significant benefits, as compared to processing the data further downstream in the digital domain after passing through an analog-to-digital converter and a digital image processor. The produced images enjoy the least latency, minimal noise, and contain maximal information while consuming the least amount of bandwidth and energy. Accordingly, such ROICs can have useful applications requiring real-time information extraction in a multifunction sensor with limited bandwidth, such as the ones used or envisioned to be used in advanced threat warning, infrared search and track, and pilotage in degraded visual environment.

It is noted that the terms "substantially" and "about" may be utilized herein to include the inherent degree of uncertainty that may be attributed to any quantitative comparison, value, measurement, or other representation. These terms are also utilized herein to represent the degree by which a quantitative representation may vary from a stated reference without resulting in a change in the basic function and intended scope of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A readout integrated circuit (ROIC) coupled to a detector array having a plurality of detectors for collecting photoelectrons over a plurality of temporal instances, the ROIC comprising a plurality of unit cells arranged in two spatial dimensions, wherein an individual unit cell of the plurality of unit cells is electrically coupled to an individual detector of the plurality of detectors to have one-to-one correspondence and comprises:
    one or more storage elements for storing signal charges representing the photoelectrons collected by the detector array at an individual temporal instance of the plurality of temporal instances; and
    one or more programmable logic control switches coupled to the one or more storage elements for directing the signal charges towards or away from the one or more storage elements at the individual temporal instance, wherein:

a configuration of signal charges in the plurality of unit cells is mathematically represented and operated as a matrix in three dimensions having a plurality of elements;

the three dimensions correspond to the two spatial dimensions and the individual temporal instance; and an individual element of the matrix has a value corresponding to the number of signal charges stored in the individual unit cell at the individual temporal instance.

2. The ROIC of claim 1, wherein the storage element is a capacitor.

3. The ROIC of claim 1, wherein:

when the one or more programmable logic control switches form a closed switch, the signal charges are directed, at the individual temporal instance, towards the one or more storage elements in series with the one or more programmable logic control switches.

4. The ROIC of claim 1, wherein the one or more programmable logic control switches in one or more individual unit cells are operably configured such that when a first storage element in a first unit cell stores a first set of signal charges received at a first temporal instance, at least one second storage element in the first unit cell or a second unit cell stores a second set of signal charges received at at least one second temporal instance.

5. The ROIC of claim 4, wherein the one or more programmable logic control switches in the one or more individual unit cells are operably configured to determine a summation of signal charges stored in the one or more individual unit cells over the plurality of temporal instances by electrically connecting in parallel the first storage element and the at least one second storage element.

6. The ROIC of claim 4, wherein the one or more programmable logic control switches in the one or more individual unit cells are operably configured to determine a difference of signal charges stored within the one or more individual unit cells by reversing a polarity of the first storage element or the at least one second storage element after the first storage element stores the first set of signal charges received at the first temporal instance and the at least one second storage element stores the second set of signal charges at the second temporal instance but before the first storage element is electrically connected in parallel with the at least one second storage element.

7. The ROIC of claim 4, wherein the one or more programmable logic control switches in the one or more individual unit cells are operably configured to determine a maximum value of signal charge stored over the plurality of temporal instances by electrically connecting the first storage element to a first source-follower amplifier and the at least one second storage element to a second source-follower amplifier through a common bias current connection.

8. The ROIC of claim 4, wherein:

the one or more programmable logic control switches in the one or more individual unit cells are operably configured to determine whether the second set of signal charges stored in the at least one second storage element is increasing or decreasing in comparison to the first set of signal charges stored in the first storage element by electrically connecting the first storage element and the at least one second storage element to a differential comparator circuit.

9. The ROIC of claim 4, wherein:

the one or more programmable logic control switches in the one or more individual unit cells are operably configured to direct the first set of signal charges received at the first temporal instance in the first storage element to the second storage element during the at least one second temporal instance.

10. The ROIC of claim 4, wherein:

the at least one second storage element comprises a second storage element, a third storage element and at least one fourth storage element;

the at least one second temporal instance comprises a second temporal instance and at least one third temporal instance;

the first storage element stores the first set of signal charges received at the first temporal instance during the second temporal instance;

the second storage element stores the second set of signal charges received at the second temporal instance;

the third storage element stores a third set of signal charges received at the at least one third temporal instance;

the one or more programmable logic control switches in the one or more individual unit cells are operably configured to hold a fourth set of signal charges in the first storage element, the second storage element or the at least one fourth storage element during the at least one third temporal instance while the third set of signal charges received during the at least one third temporal instance are stored in the third storage element;

the fourth set of signal charges is formed by a mathematical operation of the first set of signal charges received at the first temporal instance and the second set of signal charges received at the second temporal instance; and the mathematical operation is selected from at least one of: a summation of signal charges, a maximum value of signal charges, trend determination of signal charges or a difference of signal charges.

11. The ROIC of claim 1, wherein the one or more programmable logic control switches in the individual unit cell are operably configured to determine a summation of signal charges stored in the individual unit cell over successive temporal instances by electrically connecting in parallel individual storage elements of the one or more storage elements at the successive temporal instances.

12. The ROIC of claim 1, wherein the one or more programmable logic control switches in the individual unit cell are operably configured to determine a maximum value of signal charges stored over successive temporal instances by electrically connecting the individual storage elements to a source-follower amplifier through a common bias current connection.

13. The ROIC of claim 1, wherein:

the one or more programmable logic control switches in the individual unit cell are operably configured to determine whether a signal charge stored in a second storage element at a second temporal instance is increasing or decreasing in comparison to a signal charge stored in a first storage element at a first temporal instance by electrically connecting the one or more storage elements to a differential comparator circuit; and the first temporal instance and the second temporal instance are successive temporal instances.

14. The ROIC of claim 1, wherein the one or more programmable logic control switches in the individual unit cell are operably configured to determine a difference of signal charges stored within the individual unit cell over any two successive temporal instances by reversing a polarity of a first storage element or a second storage element after the first storage element and the second storage element store the signal charges at the two successive temporal instances but before the first storage element is electrically connected in parallel to the second storage element.

15. The ROIC of claim 1, wherein the one or more programmable logic control switches in the individual unit cell are operably configured to determine whether a signal charge stored in an individual storage element of the one or more storage elements at the individual temporal instance meets a threshold value by electrically connecting the individual storage element and an external voltage corresponding to the threshold value through a differential comparator circuit.

16. The ROIC of claim 1, wherein:
the detector array is coupled to a diffractive-filter array; and
one or more programmable logic control switches in the individual unit cell is further configured to identify and extract spectral signature information of an individual photon corresponding to an individual signal charge stored in the one or more storage elements.

17. The ROIC of claim 1, further comprising:
one or more programmable logic control switches coupled across a subset of adjacent unit cells within the ROIC.

18. The ROIC of claim 17, wherein the one or more programmable logic control switches coupled across the subset of adjacent unit cells are operably configured to determine whether a signal charge stored in an individual unit cell in the subset of adjacent unit cells meets a threshold value by electrically connecting the one or more storage elements in the individual unit cell and an external voltage corresponding to the threshold value through a differential comparator circuit.

19. The ROIC of claim 17, wherein:
the one or more programmable logic control switches coupled across the subset of adjacent unit cells are operably configured to direct a first set of signal charges stored in a first storage element in a first unit cell to at least a second storage element in a second unit cell; and
the first unit cell and the second unit cell are adjacent unit cells in the subset of adjacent unit cells.

20. The ROIC of claim 17, wherein the one or more programmable logic control switches coupled across the subset of adjacent unit cells are operably configured to determine a summation of signal charges stored in the subset of adjacent unit cells by electrically connecting in parallel individual storage elements of the one or more storage elements across the subset of adjacent unit cells.

21. The ROIC of claim 17, wherein the one or more programmable logic control switches coupled across the subset of adjacent unit cells are operably configured to determine a maximum value of signal charges stored in the subset of adjacent unit cells by electrically connecting individual storage elements of the one or more storage elements across the subset of adjacent unit cells to a source-follower amplifier through a common bias current connection.

22. The ROIC of claim 17, wherein:
the one or more programmable logic control switches coupled across the subset of adjacent unit cells are operably configured to determine whether signal charges stored in a second unit cell is increasing or decreasing in comparison to signal charges stored in a first unit cell by electrically connecting the one or more storage elements in the first unit cell and the second unit cell to a differential comparator circuit; and
the first unit cell and the second unit cell are adjacent unit cells in the subset of adjacent unit cells.

23. The ROIC of claim 17, wherein:
the one or more programmable logic control switches coupled across the subset of adjacent unit cells are operably configured to determine a difference of signal charges stored in any two adjacent unit cells by reversing a polarity of a first set of storage elements in a first unit cell or a second set of storage elements in a second unit cell, after the first set of storage elements and the second set of storage elements store the signal charges but before the first set of storage elements is electrically connected in parallel to the second set of storage elements; and
the first unit cell and the second unit cell are adjacent unit cells in the subset of adjacent unit cells.

24. The ROIC of claim 17, wherein:
the one or more programmable logic control switches coupled across the subset of adjacent unit cells are operably configured to determine a difference of signal charges stored in any two adjacent unit cells by directing a flow of signal charges in a first unit cell through a current mirror circuit and into a storage element in a second unit cell and directing a flow of signal charges in the second unit cell directly into the storage element; and
the first unit cell and the second unit cell are adjacent unit cells in the subset of adjacent unit cells.

25. The ROIC of claim 17, wherein the one or more programmable logic control switches coupled across the subset of adjacent unit cells are operably configured to achieve time-delay-integration (TDI) by electrically connecting in parallel the one or more storage elements across the subset of adjacent unit cells at successive temporal instances.

26. The ROIC of claim 17, wherein:
the one or more programmable logic control switches are coupled across at least two subsets of adjacent unit cells within the ROIC.

27. The ROIC of claim 26, wherein individual subsets of the at least two subsets of adjacent unit cells together form the plurality of unit cells in the ROIC.

28. The ROIC of claim 26, wherein individual subsets of the at least two subsets of adjacent unit cells have an equal number of adjacent unit cells.

29. The ROIC of claim 28, wherein individual subsets of the at least two subsets of adjacent unit cells together form the plurality of unit cells in the ROIC.

30. The ROIC of claim 26, wherein the one or more programmable logic control switches coupled across the at least two subsets of adjacent unit cells are operably configured to determine whether a signal charge stored in an individual unit cell in individual subsets of the at least two subsets of adjacent unit cells meets a threshold value by electrically connecting the one or more storage elements in the individual unit cell and an external voltage corresponding to the threshold value to a differential comparator circuit.

31. The ROIC of claim 26, wherein:
the one or more programmable logic control switches coupled across the at least two subsets of adjacent unit cells are operably configured to direct a first set of signal charges stored in a first storage element in a first unit cell to at least a second storage element in a second unit cell; and
the first unit cell and the second unit cell belong to different subsets in the at least two subsets of adjacent unit cells.

32. The ROIC of claim 26, wherein the one or more programmable logic control switches coupled across the at least two subsets of adjacent unit cells are operably configured to determine a summation of signal charges stored in the at least two subsets of adjacent unit cells by electrically connecting in parallel individual storage elements of the one or more storage elements across the at least two subsets of adjacent unit cells.

33. The ROIC of claim 26, wherein the one or more programmable logic control switches coupled across the at least two subsets of adjacent unit cells are operably configured to determine a maximum value of signal charges stored in the at least two subsets of adjacent unit cells by electrically connecting individual storage elements of the one or more storage elements across the at least two subsets of adjacent unit cells to a source-follower amplifier through a common bias current connection.

34. The ROIC of claim 26, wherein:
the one or more programmable logic control switches coupled across the at least two subsets of adjacent unit cells are operably configured to determine whether signal charges stored in a second unit cell is increasing or decreasing in comparison to signal charges stored in a first unit cell by electrically connecting the one or more storage elements in the first unit cell and the second unit cell to a differential comparator circuit; and
the first unit cell and the second unit cell belong to different subsets in the at least two subsets of adjacent unit cells.

35. The ROIC of claim 26, wherein:
the one or more programmable logic control switches coupled across the at least two subsets of adjacent unit cells are operably configured to determine a difference of signal charges stored in any two unit cells by reversing a polarity of a first set of one or more storage elements in a first unit cell or a second set of one or more storage elements in a second unit cell, after the first set of storage elements and the second set of storage elements store the signal charges but before the first set of storage elements is electrically connected in parallel to the second set of storage elements; and
the first unit cell and the second unit cell belong to different subsets in the at least two subsets of adjacent unit cells.

36. The ROIC of claim 26, wherein:
the one or more programmable logic control switches coupled across the at least two subsets of adjacent unit cells are operably configured to determine a difference of signal charges stored in any two unit cells by directing a flow of signal charges in a first unit cell through a current mirror circuit and into a storage element in a second unit cell and directing a flow of signal charges in the second unit cell directly into the storage element; and
the first unit cell and the second unit cell belong to different subsets in the at least two subsets of adjacent unit cells.

37. The ROIC of claim 26, wherein the one or more programmable logic control switches coupled across the at least two subsets of adjacent unit cells are operably configured to achieve time-delay-integration (TDI) by electrically connecting in parallel the one or more storage elements across the at least two subsets of adjacent unit cells at successive temporal instances.

38. An infrared sensor assembly comprising:
a detector array having a plurality of detectors for collecting photoelectrons over a plurality of temporal instances; and
a readout integrated circuit (ROIC) coupled to the detector array and comprising a plurality of unit cells arranged in two spatial dimensions, wherein:
an individual unit cell of the plurality of unit cells is electrically coupled to an individual detector of the plurality of detectors to have one-to-one correspondence, and
the individual unit cell comprises:
one or more storage elements for storing signal charges representing the photoelectrons collected by the detector array at an individual temporal instance of the plurality of temporal instances; and
one or more programmable logic control switches coupled to the one or more storage elements for directing the signal charges towards or away from the one or more storage elements at the individual temporal instance, wherein:
a configuration of signal charges in the plurality of unit cells is mathematically represented and operated as a matrix in three dimensions having a plurality of elements;
the three dimensions correspond to the two spatial dimensions and the individual temporal instance; and
an individual element of the matrix has a value corresponding to the number of signal charges stored in the individual unit cell at the individual temporal instance.

* * * * *